(12) United States Patent
Alves Moreira et al.

(10) Patent No.: US 9,568,498 B2
(45) Date of Patent: Feb. 14, 2017

(54) CONCEPT FOR EXTRACTING A SIGNAL BEING EXCHANGED BETWEEN A DEVICE UNDER TEST AND AN AUTOMATIC TEST EQUIPMENT

(71) Applicants: Jose Antonio Alves Moreira, Stuttgart (DE); Marc Moessinger, Renningen (DE)

(72) Inventors: Jose Antonio Alves Moreira, Stuttgart (DE); Marc Moessinger, Renningen (DE)

(73) Assignee: Advantest Corporation, Tokyo (JP)

( * ) Notice: Subject to any disclaimer, the term of this patent is extended or adjusted under 35 U.S.C. 154(b) by 313 days.

(21) Appl. No.: 14/267,806

(22) Filed: May 1, 2014

(65) Prior Publication Data

US 2014/0239994 A1 Aug. 28, 2014

Related U.S. Application Data

(63) Continuation of application No. PCT/EP2011/069751, filed on Nov. 9, 2011.

(51) Int. Cl.
| | |
|---|---|
| *G01R 1/067* | (2006.01) |
| *G01R 31/319* | (2006.01) |
| *G01R 31/28* | (2006.01) |
| *G11C 29/56* | (2006.01) |
| *H05K 1/02* | (2006.01) |

(52) U.S. Cl.
CPC .......... *G01R 1/067* (2013.01); *G01R 31/2889* (2013.01); *G01R 31/31905* (2013.01); *G11C 29/56016* (2013.01); *H05K 1/0268* (2013.01); *G11C 2029/5602* (2013.01); *H05K 1/0234* (2013.01); *H05K 1/0251* (2013.01); *H05K 2201/09254* (2013.01); *H05K 2201/09809* (2013.01); *H05K 2203/162* (2013.01)

(58) Field of Classification Search
CPC combination set(s) only.
See application file for complete search history.

(56) References Cited

U.S. PATENT DOCUMENTS

| | | | |
|---|---|---|---|
| 6,331,783 B1 | 12/2001 | Hauptman | |
| 2005/0251715 A1* | 11/2005 | Loh .................... | G06F 11/2257 |
| | | | 714/736 |
| 2008/0191707 A1 | 8/2008 | Collins | |

FOREIGN PATENT DOCUMENTS

WO  WO2010054669  5/2010

* cited by examiner

*Primary Examiner* — Clayton E Laballe
*Assistant Examiner* — Jas Sanghera

(57) ABSTRACT

A printed circuit board has first terminals for contacting terminals of a socket, second terminals for contacting terminals of a test fixture of an automatic test equipment, which are adapted for contacting the terminals of the socket of a device under test, transmission lines for connecting the first terminals and the terminals, and an extracting circuit electrically coupled to one of the transmission lines and configured to extract the signal being exchanged between the device under test and the automatic test equipment. The extracting circuit has a resistor or an electrical resistor network, wherein a loss added on the signal being exchanged between the device under test and the automatic test equipment over the one transmission line due to the presence of the printed circuit board is smaller than 6 dB.

23 Claims, 22 Drawing Sheets

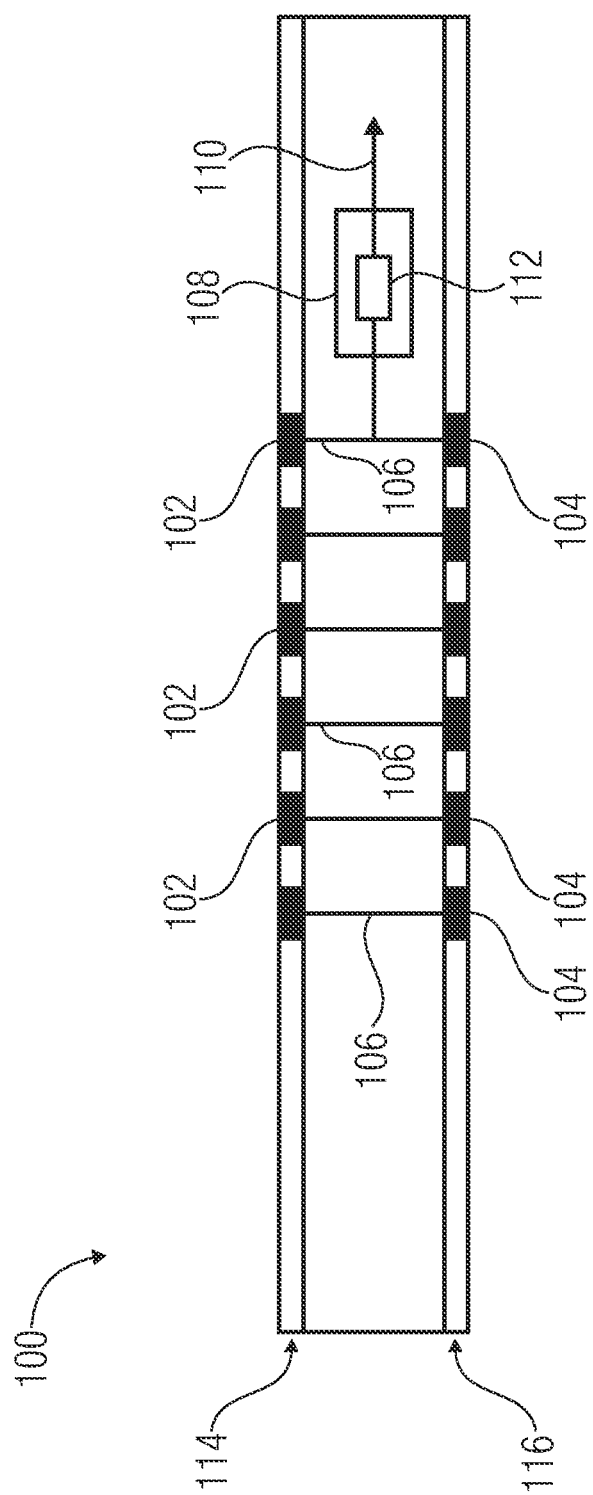

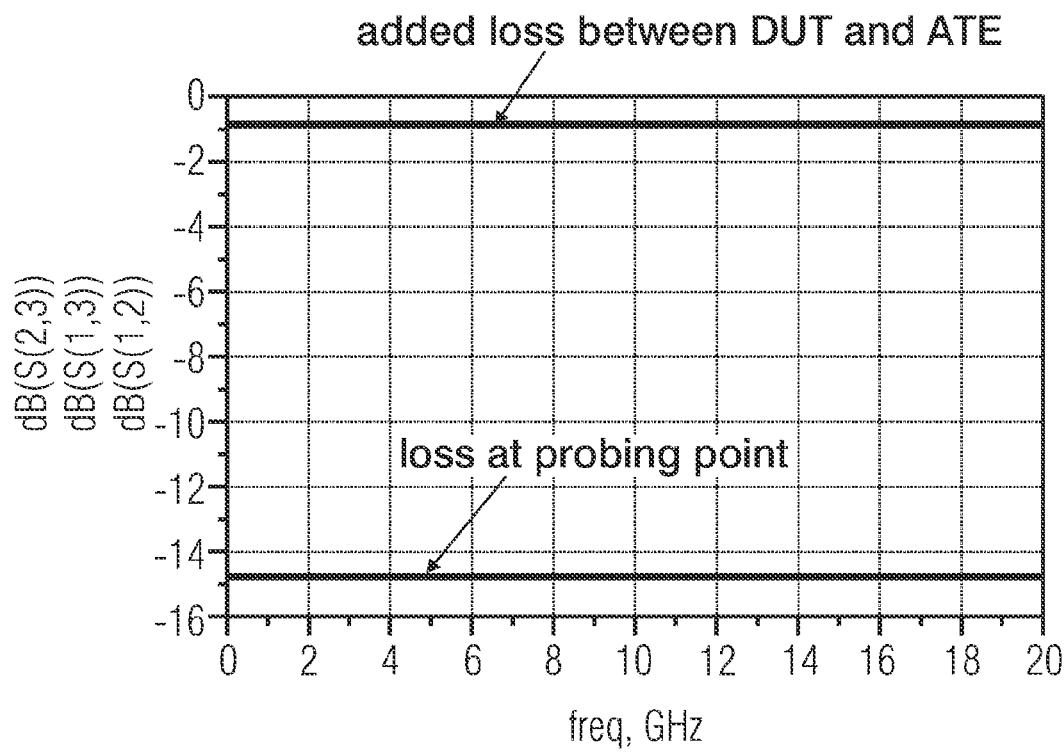
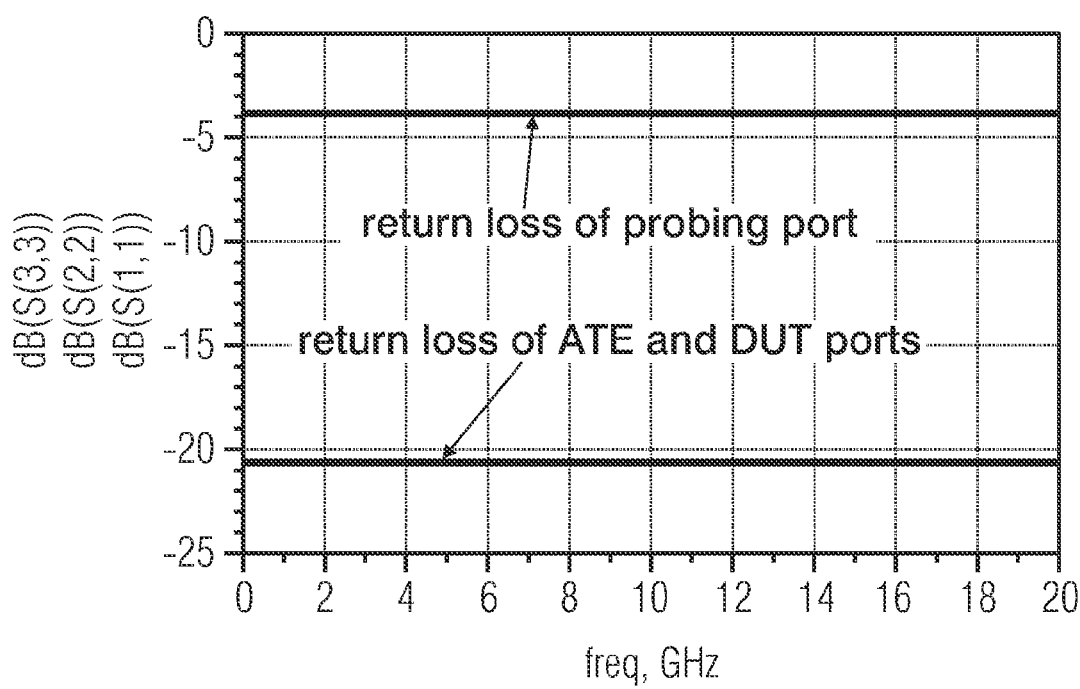
FIG 9B

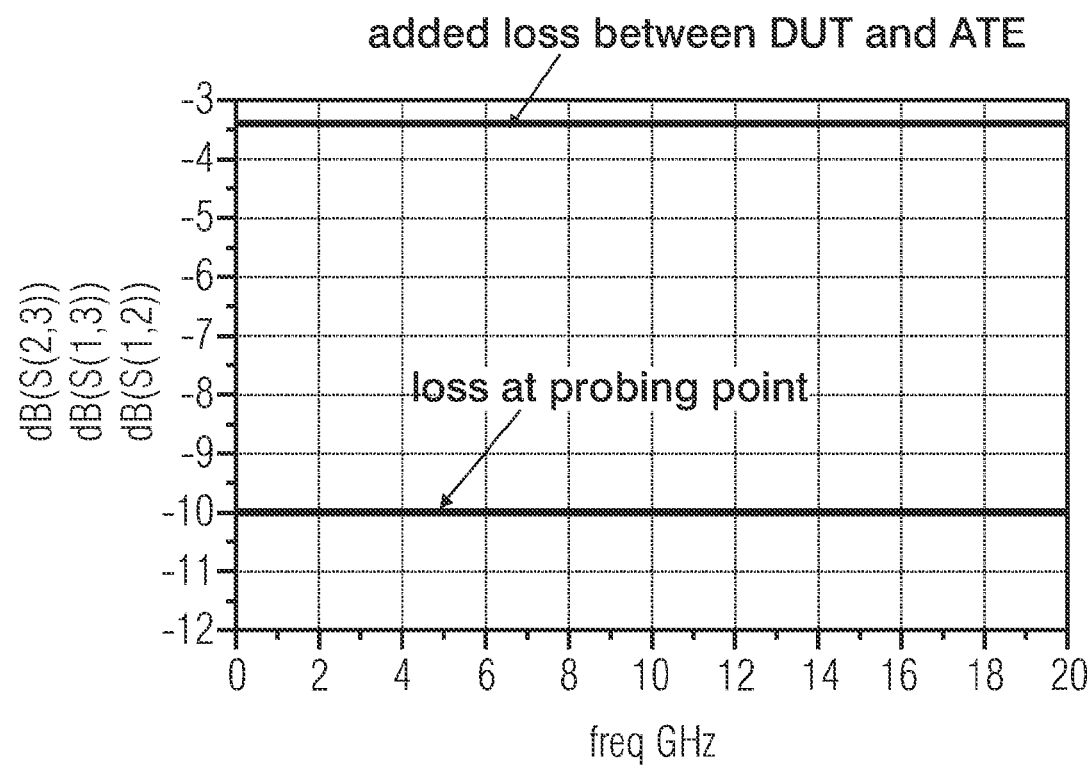
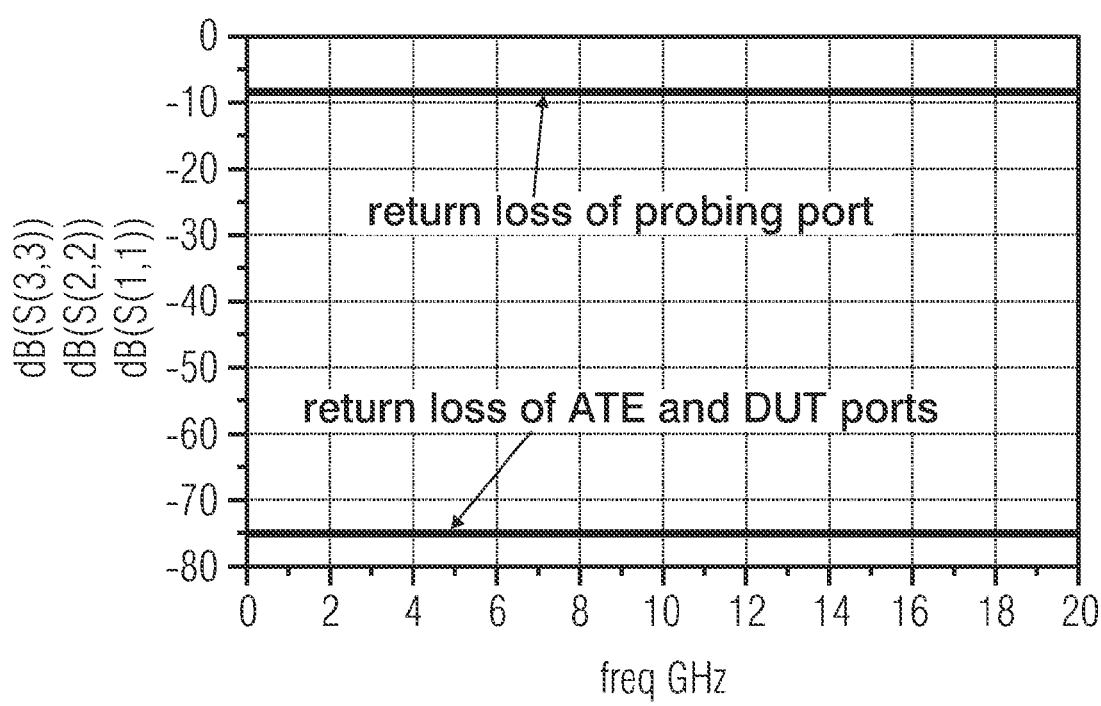
FIG 13B

CONCEPT FOR EXTRACTING A SIGNAL BEING EXCHANGED BETWEEN A DEVICE UNDER TEST AND AN AUTOMATIC TEST EQUIPMENT

CROSS-REFERENCE TO RELATED APPLICATION

This application is a continuation of copending International Application No. PCT/EP2011/069751, filed Nov. 9, 2011, which is incorporated herein by reference in its entirety.

BACKGROUND OF THE INVENTION

Embodiments of the present invention relate to a concept for extracting a signal being exchanged between a device under test and an automatic test equipment. Some embodiments of the present invention relate to a method to probe the transmitted and received signals between a device under test and an automatic test equipment pin electronics channel.

High-speed memory applications like DDR4 (DDR4=double data rate type four) can be characterized and tested using an automatic test equipment (ATE) 10. In an initial characterization step, it can be of significant help for the test engineer to measure the signals being exchanged between the automatic test equipment 10 and the device under test (DUT) 20 using an external instrument 30 as shown in FIG. 1a. The challenge of this setup is to make sure that at the probing point 40 the signal integrity is good enough to measure the signals being exchanged between the automatic test equipment 10 and the device under test 20 with a high fidelity. At the same time, it is also important to guarantee that the probing setup does have a minimal impact on the signal integrity between the device under test 20 and automatic test equipment 10 and in this way degrade the signals form the automatic test equipment 10 or the device under test 20. Nevertheless, it is very difficult to create a probing point 40 that does have a minimal impact on the signal integrity between the device under test 20 and the automatic test equipment 10 pin electronics.

Previous solutions include probing the back of the non-backdrilled vias to the device under test 20 ball grid array (BGA) on the automatic test equipment test fixture printed circuit board (PCB) 50 as shown in FIG. 1b. This approach presents significant problems for high-speed applications because the via stub 60 has a significant impact on the signal integrity and the probing circuit cannot be removed.

In addition, probe traces and circuitry can be implemented on the device under test 20 test fixture PCB, but they cannot be removed easily, meaning that they will have an impact on the device under test 20 to automatic test equipment 10 performance. They also necessitate careful design to provide a good signal integrity for high-speed applications.

SUMMARY

According to an embodiment, a printed circuit board for extracting a signal being exchanged between a device under test and an automatic test equipment may have: a plurality of first terminals for contacting terminals of a socket of the device under test; a plurality of second terminals for contacting terminals of a test fixture of the automatic test equipment which are adapted for contacting the terminals of the socket of the device under test; a plurality of transmission lines connecting the plurality of first terminals and the plurality of second terminals; and an extracting circuit electrically coupled to one of the plurality of transmission lines and configured to extract the signal being exchanged between the device under test and the automatic test equipment over the one transmission line in order to provide an extracted signal, wherein the extracting circuit has a resistor or a resistor network, wherein a loss added on the signal being exchanged between the device under test and the automatic test equipment over the one transmission line due to the presence of the printed circuit board is smaller than 6 dB According to another embodiment, an automatic test equipment system may have: a device under test having a socket with terminals; an automatic test equipment having a test fixture with terminals which are adapted for contacting the terminals of the socket of the device under test; and a printed circuit board for extracting a high-frequency signal being exchanged between the device under test and the automatic test equipment, the printed circuit board having: a plurality of first terminals for contacting the terminals of the socket of the device under test; a plurality of second terminals for contacting terminals of the test fixture of the automatic test equipment; a plurality of transmission lines connecting the plurality of first terminals and the plurality of second terminals; and an extracting circuit electrically coupled to one of the plurality of transmission lines and configured to extract the signal being exchanged between the device under test and the automatic test equipment over the one transmission line, wherein the extracting circuit has a resistor or an electrical resistor network, wherein a loss added on the signal being exchanged between the device under test and the automatic test equipment over the one transmission line due to the presence of the printed circuit board is smaller than 6 dB; wherein the printed circuit board is arranged between the socket of the device under test and the test fixture of the automatic test equipment such that the plurality of first terminals are contacting the terminals of the socket of the device under test and the plurality of second terminals are contacting the terminals of the test fixture of the automatic test equipment.

According to another embodiment, a method for extracting a signal being exchanged between a device under test and an automatic test equipment with a printed circuit board having: a plurality of first terminals for contacting the terminals of the socket of the device under test; a plurality of second terminals for contacting terminals of the test fixture of the automatic test equipment; a plurality of transmission lines connecting the plurality of first terminals and the plurality of second terminals; and an extracting circuit electrically coupled to one of the plurality of transmission lines and configured to extract the signal being exchanged between the device under test and the automatic test equipment over the one transmission line, wherein the extracting circuit has a resistor or an electrical resistor network, wherein a loss added on the signal being exchanged between the device under test and the automatic test equipment over the one transmission line due to the presence of the printed circuit board is smaller than 6 dB; may have the step of: arranging the printed circuit board between the socket of the device under test and the test fixture of the automatic test equipment such that the plurality of first terminals are contacting the terminals of the socket of the device under test and the plurality of second terminals are contacting the terminals of the test fixture of the automatic test equipment.

Another embodiment may have a computer program having a program code for performing, when running on a computer or microprocessor, the above method for extracting a signal.

In embodiments, the printed circuit board comprising the plurality of first terminals and the plurality of second terminals can be arranged between the device under test and the automatic test equipment such that the plurality of first terminals are contacting the terminals of the socket of the device under test and the plurality of second terminals are contacting the terminals of the test fixture of the automatic test equipment. The printed circuit board comprises a plurality of transmission lines connecting the plurality of first terminals and the plurality of second terminals, wherein an extracting circuit is electrically coupled to one of the plurality of transmission lines and configured to extract the signal being exchanged between the device under test and the automatic test equipment over the one transmission line. The extracting circuit comprises of a resistor or an electrical resistor network, wherein a loss added on the signal being exchanged between the device under test and the automatic test equipment over the one transmission line due to the presence of the printed circuit board is smaller than 6 dB.

Further embodiments of the present invention provide an automatic test equipment system comprising a device under test, an automatic test equipment and a printed circuit board. The device under test comprises a packaged integrated circuit with terminals. The automatic test equipment comprises a test fixture and a socket with terminals which are adapted for contacting the terminals of the packaged device under test. The printed circuit board comprises a plurality of first terminals, a plurality of second terminals, a plurality of transmission lines and an extracting circuit. The plurality of first terminals are configured for contacting terminals of a socket of the device under test. The plurality of second terminals are configured for contacting terminals of a test fixture of the automatic test equipment, which are adapted for contacting the terminals of the socket of the device under test. The plurality of transmission lines are configured for connecting the plurality of first terminals and the plurality of second terminals. The extracting circuit is electrically coupled to one of the plurality of transmission lines and configured to extract the signal being exchanged between the device under test and the automatic test equipment over the one transmission line in order to provide an extracted signal, wherein the extracting circuit comprises a resistor or an electrical resistor network, wherein a loss added on the signal being exchanged between the device under test and the automatic test equipment over the one transmission line due to the presence of the printed circuit board is smaller than 6 dB. The printed circuit board is arranged between the socket of the device under test and the test fixture of the automatic test equipment such that the plurality of first terminals are contacting the terminals of the socket of the device under test and the plurality of second terminals are contacting the terminals of the test fixture of the automatic test equipment.

Further embodiments of the present invention provide a method for extracting a signal being exchanged between a device under test and an automatic test equipment with a printed circuit board. The printed circuit board comprises a plurality of first terminals, a plurality of second terminals, a plurality of transmission lines and an extracting circuit. The plurality of first terminals are configured for contacting terminals of a socket of the device under test. The plurality of second terminals are configured for contacting terminals of a test fixture of the automatic test equipment, which are adapted for contacting the terminals of the socket of the device under test. The plurality of transmission lines are configured for connecting the plurality of first terminals and the plurality of second terminals. The extracting circuit is electrically coupled to one of the plurality of transmission lines and configured to extract the signal being exchanged between the device under test and the automatic test equipment over the one transmission line in order to provide an extracted signal, wherein the extracting circuit comprises a resistor or an electrical resistor network, wherein a loss added on the signal being exchanged between the device under test and the automatic test equipment is smaller than 6 dB. The method comprises a step of arranging the printed circuit board between the socket of the device under test and the test fixture of the automatic test equipment such that the plurality of first terminals are contacting the terminals of the socket of the device under test and the plurality of second terminals are contacting the terminals of the test fixture of the automatic test equipment.

BRIEF DESCRIPTION OF THE DRAWINGS

Embodiments of the present invention are described herein making reference to the appended drawings, in which:

FIG. 2 shows a block diagram of a printed circuit board according to an embodiment of the present invention;

FIG. 9b shows in a diagram simulation results obtained with the schematic shown in FIG. 9a for simulating the automatic test equipment system;

FIG. 13b shows in a diagram simulation results obtained with the schematic shown in FIG. 13a for simulating the automatic test equipment system;

DETAILED DESCRIPTION OF THE INVENTION

Figure 1A:
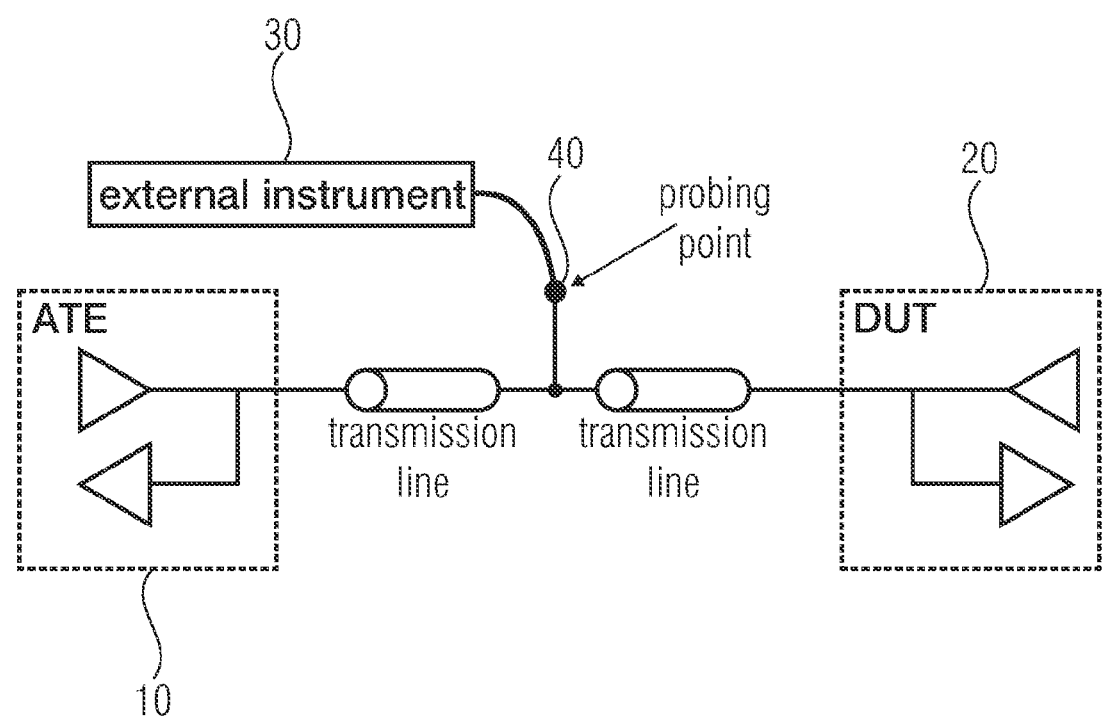
FIG. 1a shows a block diagram of a common automatic test equipment system comprising a device under test, a automatic test equipment and a probing point between the device under test and the automatic test equipment.
Figure 1B:
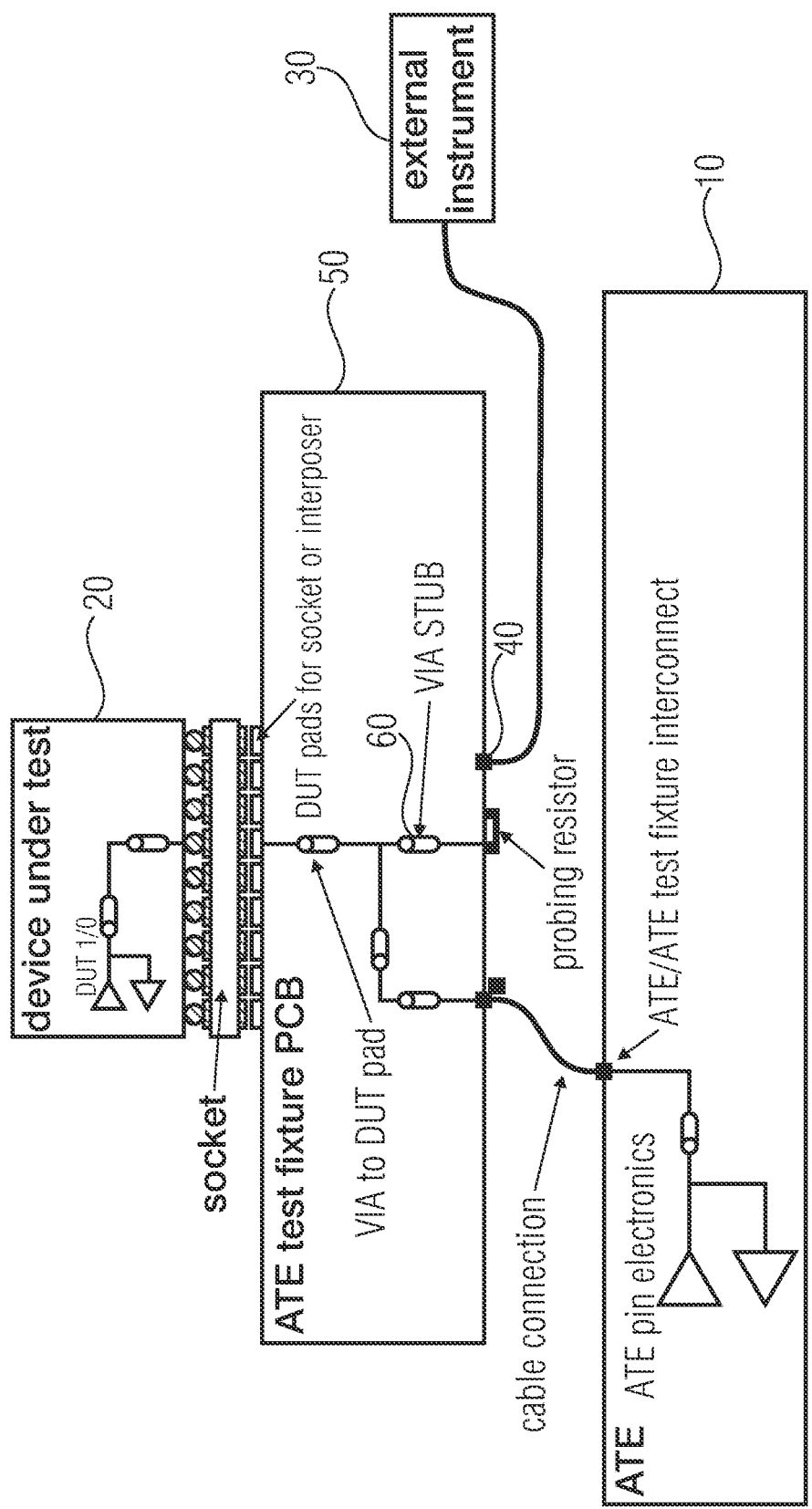
FIG. 1b shows a block diagram of a common automatic test equipment system comprising a device under test, a automatic test equipment and a probing point between the device under test and the automatic test equipment.

Equal or equivalent elements or elements with equal or equivalent functionality are denoted in the following description by equal or equivalent reference numerals.

In the following description, a plurality of details are set forth to provide a more thorough explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other unless specifically noted otherwise.

FIG. 2 shows a block diagram of a printed circuit board 100 according to an embodiment of the present invention. The printed circuit board 100 comprises a plurality of first terminals 102, a plurality of second terminals 104, a plurality of transmission lines 106 and an extracting circuit 108. The plurality of first terminals 102 are configured for contacting terminals of a socket of the device under test. The plurality of the second terminals 104 are configured for contacting terminals of a test fixture of the automatic test equipment which are adapted for contacting the terminals of the socket of the device under test. The plurality of transmission lines 106 are configured for connecting the plurality of first terminals 102 and the plurality of second terminals 104. The extracting circuit 108 is electrically coupled to one of the plurality of transmission lines 106 and configured to extract the signal being exchanged between the device under test and the automatic test equipment over the one transmission line 106 in order to provide an extracted signal 110. The extracting circuit 108 comprises of a resistor (112) or an electrical resistor network, wherein a loss added on the signal being exchanged between the device under test (124) and the automatic test equipment (122) over the one transmission line due to the presence of the printed circuit board (100) is smaller than 6 dB (or 1 dB, 3 dB or 10 dB).

In embodiments, the resistor 112 or the resistor network of the extracting circuit 108 can be adapted to an impedance of the one transmission line 106 such that a loss of the signal being exchanged between the device under test 124 and the automatic test equipment 122 over the one transmission line 106 is smaller than 10 dB. For example, the electrical resistor network can be designed to reduce or even minimize the added insertion loss on the transmission line 106. Furthermore, the extracting circuit (108) can comprise a resistor or an electrical resistor network designed to reduce an impact on the integrity of the signal being exchanged between the device under test (124) and the automatic test equipment (122) over the signal path (106) between the ATE pin electronics and the DUT (124).

In other words, FIG. 2 shows a block diagram of a printed circuit board 100 according to an embodiment of the present invention. The printed circuit board 100 comprises a plurality of first terminals 102, a plurality of second terminals 104, a plurality of transmission lines 106 and an extracting circuit 108. The plurality of first terminals 102 are configured for contacting terminals of a socket of the device under test. The plurality of the second terminals 104 are configured for contacting terminals of a test fixture of the automatic test equipment which are adapted for contacting the terminals of the socket of the device under test. The plurality of transmission lines 106 are configured for connecting the plurality of first terminals 102 and the plurality of second terminals 104. The extracting circuit 108 is electrically coupled to one of the plurality of transmission lines 106 and configured to extract the signal being exchanged between the device under test and the automatic test equipment over the one transmission line 106 in order to provide an extracted signal 110. The extracting circuit 108 comprises a resistor 112 adapted to an impedance of the one transmission line 106, such that a loss of the signal being exchanged between the device under test and the automatic test equipment over the one transmission line 106 due to the presence of the printed circuit board 100 is smaller than 6 dB.

In embodiments, the printed circuit board 100 can be arranged (or inserted, or interposed) between the device under test and the automatic test equipment such that the plurality of first terminals 102 are contacting the terminals of the socket of the device under test and the plurality of second terminals 104 are contacting the terminals of the test fixture of the automatic test equipment. In order to extract a signal being exchanged between the device under test and the automatic test equipment the printed circuit board 100 comprises an extracting circuit 108 that is electrically coupled to one of the plurality of transmission lines 106. The extracting circuit 108 comprises of a electrical resistor network 112 designed in order to reduce an impact on the integrity of the signal being exchanged between the device under test and the automatic test equipment over the one transmission line 106.

In some embodiments, an insertion loss of the signal being exchanged between the device under test 124 and the automatic test equipment 122 over the one transmission line 106 due to an impedance discontinuity of the printed circuit board 100 can be smaller than 6 dB (or 1 dB, 3 dB, 7 dB or 10 dB). In other words, embodiments of the present invention provide a single resistor or a electrical resistor network that reduces (or even minimizes) the inserted loss between ATE and DUT to less than 6 dB.

Furthermore, a return loss of the signal being exchanged between the device under test 124 and the automatic test equipment 122 over the one transmission line 106 due to the presence of the printed circuit board can be smaller than −10 dB (or −20 dB, −30 dB, −40 dB or −50 dB). In other words, embodiments of the present invention provide single resistor or an electrical resistor network that can reduce (or even minimize) the return loss in the ATE and DUT ports of the probing circuit to less than −20 dB (or −10 dB or −50 dB).

Moreover, the extracting circuit 108 can be configured to provide the extracted signal 110 such that a loss of the extracted signal 110 compared to the signal being exchanged between the device under test 124 and the automatic test equipment 122 over the one transmission line (106) is smaller than 20 dB. In other words, embodiments of the present invention provide a single resistor or an electrical resistor network that can reduce (or even minimize) the inserted loss between the probing point and the measurement instrument to less than 20 dB.

In addition, the extracting circuit 108 can be configured to provide the extracted signal 110 such that a return loss of the extracted signal 110 is smaller than −4 dB (or −7 dB, −10 dB or −20 dB). In other words, embodiments of the present invention provide single resistor or an electrical resistor network that can reduce (or even minimize) the return loss on the probing port to less than −10 db (or −4 dB or −20 dB).

In embodiments, at the same time a compromise can be made between the loss on the extracted signal (110) and the noise on the extracted signal (110) since more loss usually implies a smaller discontinuity but necessitates a higher amplification of the extracted signal (110) which usually implies more noise on the extracted signal.

In embodiments, the signal being exchanged between the device under test and the automatic test equipment over the one transmission line 106 can for a DDR4 application running at 4 Gbps comprise the frequency range between DC and 6 GHz corresponding to the need to have for digital signals a bandwidth between DC and 3 times the fundamental frequency or for a PCI Express 3 or GDDR 5 application running at 8 Gbps compromise the frequency range between DC and 12 GHz.

In order to avoid mismatches and the resulting effects, e.g. reflections, losses and/or distortions, the plurality of transmission lines 106 can comprise an impedance adapted to an (internal) impedance of the automatic test equipment and/or of the device under test. For example, the automatic test equipment can comprise an (internal) impedance of 50Ω (or 60Ω, or 70Ω, or 100Ω) wherein the plurality of transmission lines 106 can also comprise an impedance of 50Ω (or 60Ω, or 70Ω, or 100Ω) adapted to the impedance of the automatic test equipment. Naturally, also the device under test can comprise an (internal) impedance of 50Ω (or 60Ω, or 70Ω, or 100Ω) wherein the plurality of transmission lines 106 can also comprise an impedance of 50Ω (or 60Ω, or 70Ω, or 100Ω) adapted to the impedance of the device under test. Moreover, the impedance of the plurality of transmission lines 106 can be adapted to the (internal) impedance of the automatic test equipment and of the device under test, such that the impedance of the plurality of transmission lines 106, the impedance of the automatic test equipment and the impedance of the device under test comprise the same value, e.g. 50Ω (or 60Ω, or 70Ω or 100Ω).

In embodiments, the plurality of first terminals 102 can be arranged on the top layer 114 of the printed circuit board 100, wherein the plurality of second terminals 104 can be arranged on the bottom layer 116 of the printed circuit board 100, different from the first layer 114. Moreover, the plurality of transmission lines 106 can be vias 106 connecting the plurality of first terminals 102 arranged on the first layer 114 of the printed circuit board 100 and the plurality of second terminals 104 arranged on the bottom layer 116 of the printed circuit board 100. In addition, the top layer 114 and/or the bottom layer 116 of the printed circuit board 100 can comprise a filled ground plane electrically isolated from non-ground terminals 102 and 104 and/or non-ground transmission lines 106, wherein the filled ground plane can be configured for contacting a ground potential (or ground terminal) of the automatic test equipment and/or a ground potential (or ground terminal) of the device under test.

In the following, features of the printed circuit board 100 according to the concept of the present invention are described by means of an automatic test equipment system 120 comprising the printed circuit board 100, an automatic test equipment and a device under test.

Figure 3:
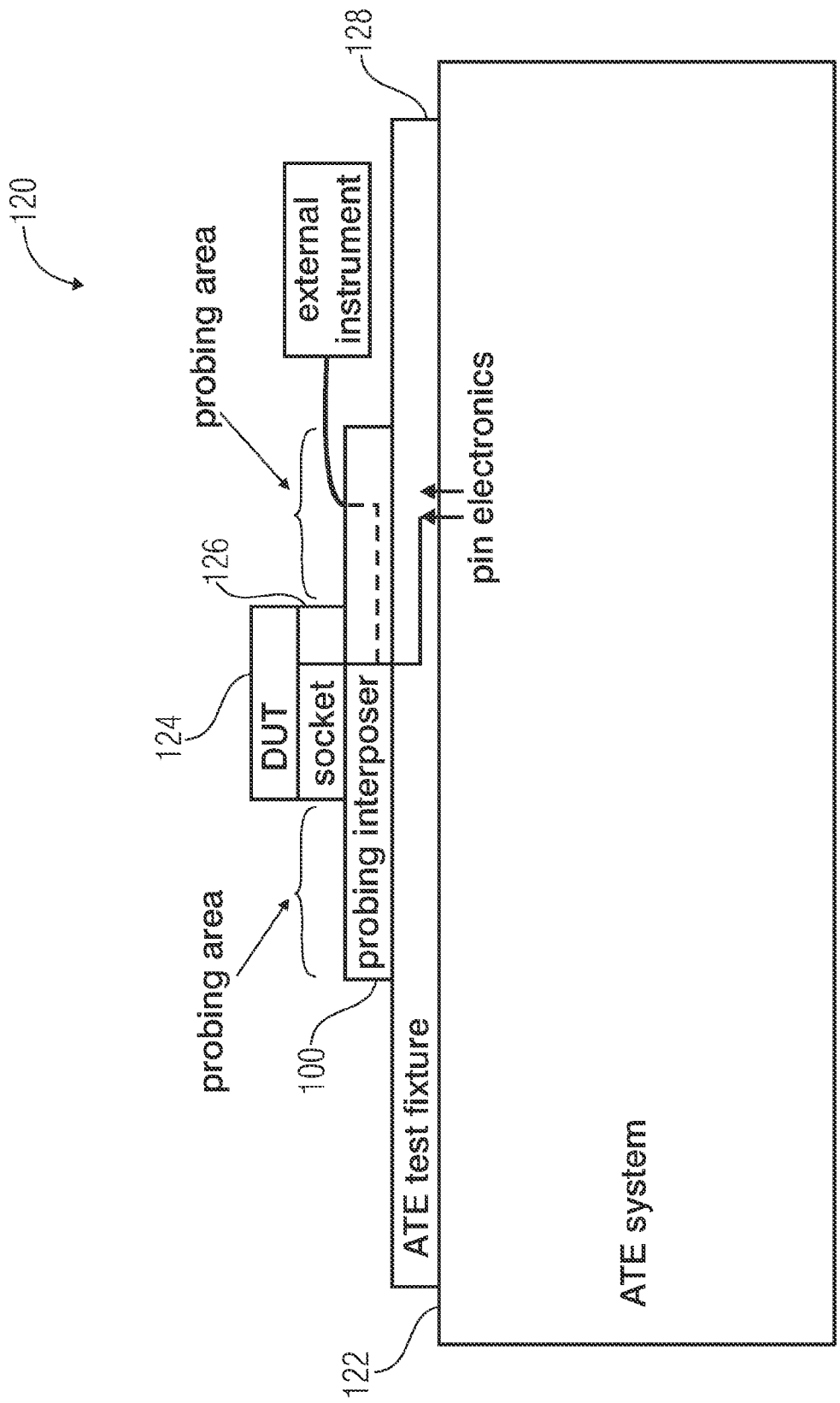
FIG. 3 shows a block diagram of an automatic test equipment system according to an embodiment of the present invention.

FIG. 3 shows a block diagram of an automatic test equipment system 120 according to an embodiment of the present invention. The automatic test equipment system 120 comprises a printed circuit board 100 (or probing interposer 100), an automatic test equipment 122 and a device under test 124. As shown in FIG. 3, the printed circuit board 100 (or probing interposer 100) can be inserted between the automatic test equipment 122 and the device under test 124 such that the plurality of first terminals 102 (e.g. plurality of first pads 102) are contacting the terminals of the socket 126 of the device under test 124 and the plurality of second terminals 104 (e.g. plurality of second pads 104) are contacting the terminals of the test fixture 128 of the automatic test equipment 122 which are adapted for contacting the terminals of the socket 126 of the device under test 124.

In other words, embodiments of the present invention provide a printed circuit board 100 (or removable interposer 100, or probing interposer 100) that can be used or inserted between the ATE test fixture 128 printed circuit board and the DUT socket 126 as shown in FIG. 3. This may guarantee that the discontinuity introduced by the probing circuit in the probing interposer 100 is as small as possible and that the loss of the signal being exchanged between the device under test 124 and the automatic test equipment 122 over the one transmission line 106 is reduced or even as small as possible.

The plurality of first terminals 102 can be configured for non-permanently contacting the terminals of the socket 126 of the device under test 124, wherein the plurality of second terminals 104 can be configured for non-permanently contacting the terminals of the test fixture 128 of the automatic test equipment 122 such that the printed circuit board 100 is removable. In other words, the probing interposer 100 can be removed when it is no longer needed.

The printed circuit board 100 (or probing interposer 100) according to the concept of the present invention allows probing the signals being exchanged between the device under test 124 and the automatic test equipment 122 pin electronics. This can be very useful for a test engineer with debugging his application. Thereby, the small size of the printed circuit board 100 provides significant advantages regarding the signal integrity of the probed signal and also the impact on the signal integrity between the device under test 124 and the automatic test equipment 122 pin electronics. Furthermore, as already mentioned, the probing interposer 100 is removable allowing the test engineer to test the device under test 124 without the impact of the probing interposer. The probing interposer 100 can also be re-used in other similar (or identical) DUT test fixtures.

Figure 4:
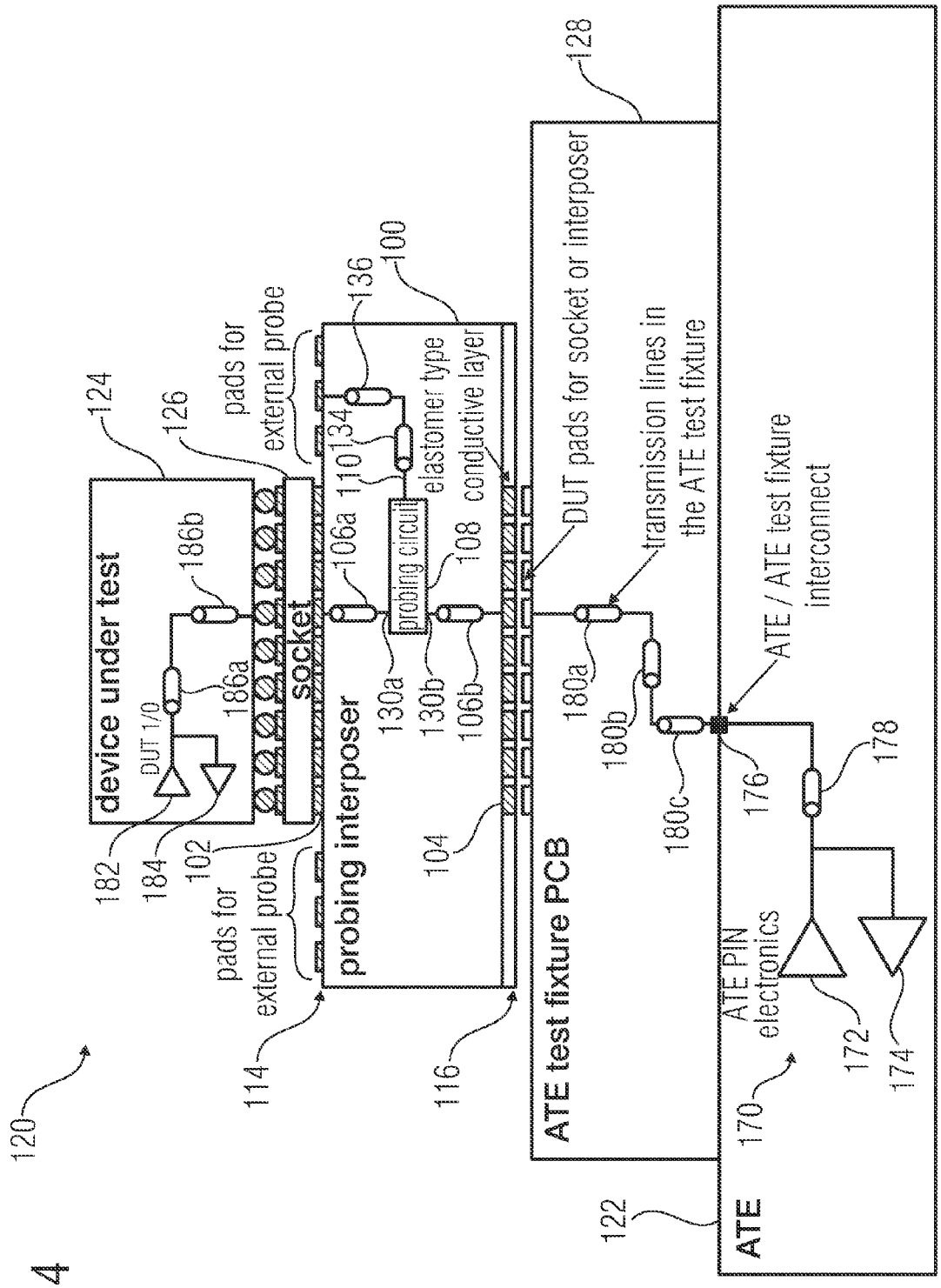
FIG. 4 shows a block diagram of a device under test and a printed circuit board according to an embodiment of the present invention.

FIG. 4 shows a block diagram of an automatic test equipment system 120 according to an embodiment of the present invention. The printed circuit board 100 can be inserted between the automatic test equipment 122 and the device under test 124 such that the plurality of first terminals 122 are contacting the terminals of the socket 126 of the device under test 124 and the plurality of second terminals 104 are contacting the terminals of the test fixture 128 of the automatic test equipment 122.

The extracting circuit 108 (or probing circuit 108) can comprise a first port 130a and a second port 130b, wherein the one transmission line 106 can be divided into (or comprise) a first part 106a and a second part 106b, wherein the first part 106a of the one transmission line 106 can be connected to the first port 130a of the probing circuit 108, wherein the second part 106b of the one transmission line 106 can be connected to the second port 130b of the extracting circuit 108.

The printed circuit board 100 can comprise a probing terminal 132 (e.g. a probing pad 132) which is electrically coupled to the extracting circuit 108 for providing the extracted signal 110 at the probing terminal 132. The probing terminal 132 can be electrically coupled to the extracting circuit 108 by means of a probing transmission line 134 having an impedance adapted to the impedance of the one transmission line 106 (or first part 106a and/or second part 106b of the one transmission line 106). Furthermore, the probing terminal 132 can be electrically coupled to the probing transmission line 134 by means of a probing via 136 having an impedance adapted to the impedance of the one transmission line 106 (or first part 106a and/or second part 106b of the one transmission line 106). Moreover, the printed circuit board 100 can comprise a termination resistor connected in series between the probing terminal and a ground potential (or ground terminal) of the printed circuit board 100, wherein the termination resistor can be adapted to the impedance of the one transmission line 106.

For example, the automatic test equipment 122 and/or the device under test 124 can comprise an (internal) impedance of 50Ω (or 60Ω, or 70Ω, or 100Ω) wherein the plurality of transmission lines 106 can also comprise an impedance of 50Ω (or 60Ω, or 70Ω, or 100Ω) adapted to the impedance of the automatic test equipment 122 and/or the device under test 124. In addition, the probing circuit 108, the probing transmission line 134, the probing via 136 and/or the termination resistor can also have impedances of 50Ω (or 60Ω, or 70Ω, or 100Ω) adapted to the impedance of the one transmission line and hence to the (internal) impedance of the automatic test equipment 122 and/or the device under test 124, thereby avoiding mismatches and the resulting effects.

The automatic test equipment 122 can comprise a plurality of channels, each channel of the plurality of channels comprising a driver 172 and a receiver 174 (or pin electronics 170) electrically coupled to an ATE/ATE test fixture interconnect 176 by means of an channel transmission line 178 as shown in FIG. 4. Moreover, the test fixture printed circuit board 128 can comprise transmission lines 180a to 180c for electrically coupling each terminal with the corresponding ATE/ATE test fixture interconnect 176.

The device under test 124 can also comprise a plurality of channels, each channel of the plurality of channels comprising a driver 182 and a receiver 184 electrically coupled to the socket 126 of the device under test 124 by means of transmission lines 180a and 180b.

In order to improve the electrical connection between the plurality of first terminals 102 and the terminals of the socket 126 of the device under test 124, and/or the electrical connection between the plurality of second terminals 104 and the terminals of the test fixture 128 of the automatic test equipment 122, the plurality of first terminals 102 can comprise of copper pads that are connected to the socket through the socket pogo pins or elastomer contacts, a conductive elastomeric material. In other words, the first layer 114 of the printed circuit board 100 can comprise at least in an area of the plurality of first terminals 102 copper pads with the diameter and pitch appropriated to the DUT package geometry. Furthermore, the second layer 116 of the printed circuit board can comprise at least in an area of the plurality of a second terminals 104 a conductive elastomeric material and in an area between the plurality of second terminals 104 a non-conductive conductive rigid material (e.g. Kapton) with a smaller height to provide a hard stop to avoid over compressing the conductive elastomeric material.

According to the concept of the present invention, a removable printed circuit board 100 with embedded discrete components (to create the probing circuit 108) and a conductive elastomeric material on the bottom 116 and copper pads on the top 114 can be used to provide a good electrical connection between the ATE test fixture PCB 128 and the probing interposer 100 as shown in FIG. 4.

Figure 5:
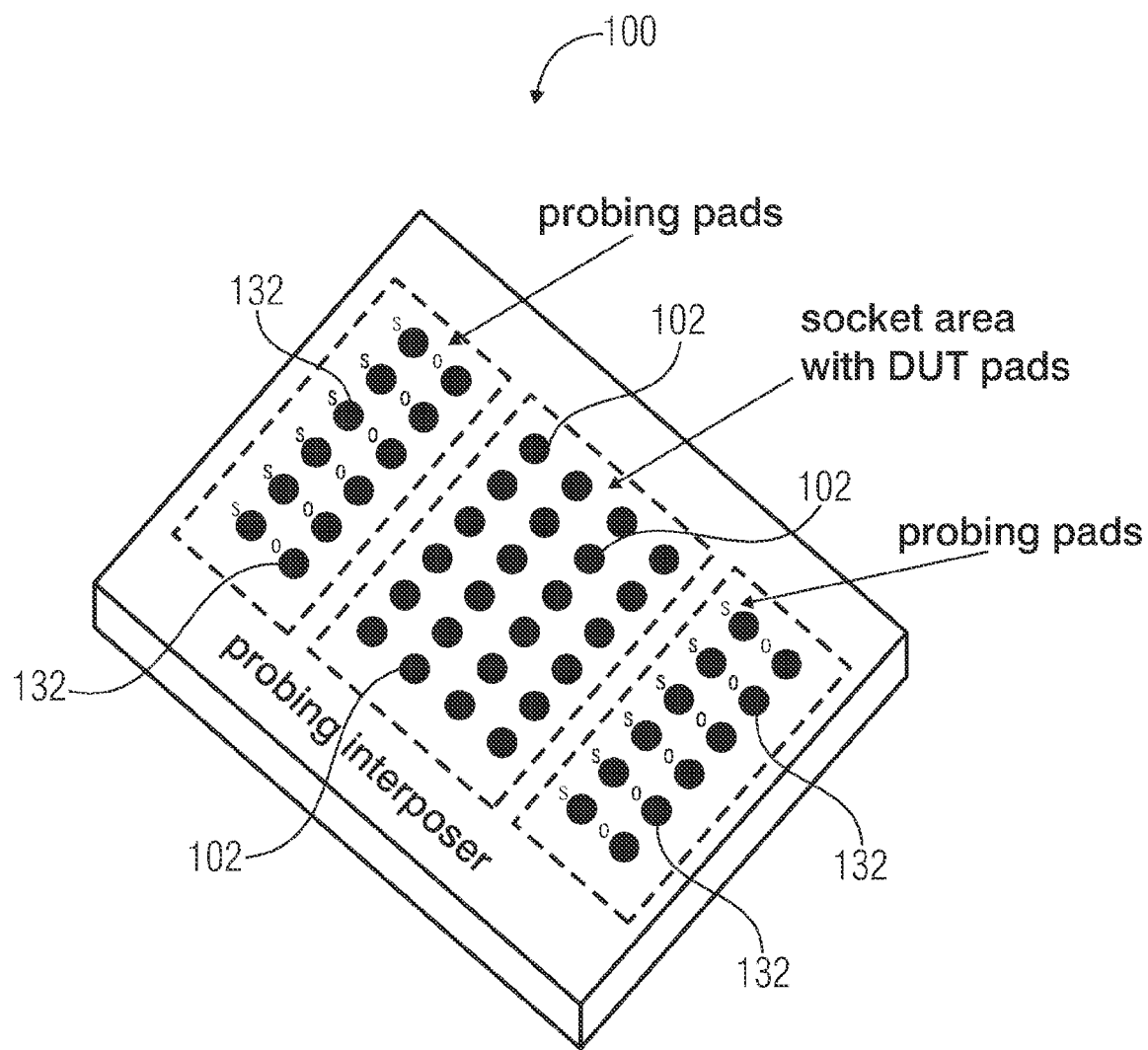
FIG. 5 shows an illustrative view on the top of the printed circuit board according to an embodiment of the present invention.

FIG. 5 shows an illustrative view on the top layer 114 of the printed circuit board 100 according to an embodiment of the present invention. As shown in FIG. 5, the top layer 114 of the printed circuit board 100 may comprise a plurality of first terminals 102 for contacting the terminals of the socket 126 of the device under test 124. Moreover, the top layer 114 of the printed circuit board 100 may comprise probing terminals 132 for providing extracted signals 110.

In FIG. 5, the top layer 114 of the printed circuit board 100 comprises exemplarily 24 first terminals 102 (e.g. 24 first pads) for contacting the terminals of the socket 126 of the device under test 124 and 24 probing terminals 132 (e.g. 24 probing pads) for providing the signals 110 extracted from the signals being exchanged between the device under test 124 and the automatic test equipment 122. Naturally, the printed circuit board 100 can also comprise n first terminals 102 for contacting the terminals of the socket 126 of the device under test 124 and m probing terminals 132 for providing the signals 110 extracted, wherein n is a natural number greater than or equal to 2 (n≥2), and wherein m is a natural number greater than or equal to 1 (n≥1).

In other words, FIG. 5 shows a diagram of the probing interposer 100 from the top. The probing pads 132 can be located outside the area where the socket 126 mates with the interposer 100 so that they can be easily accessed. These probing pads 132 can be designed using different techniques depending on the probing approach as described in the following.

Figure 6A:
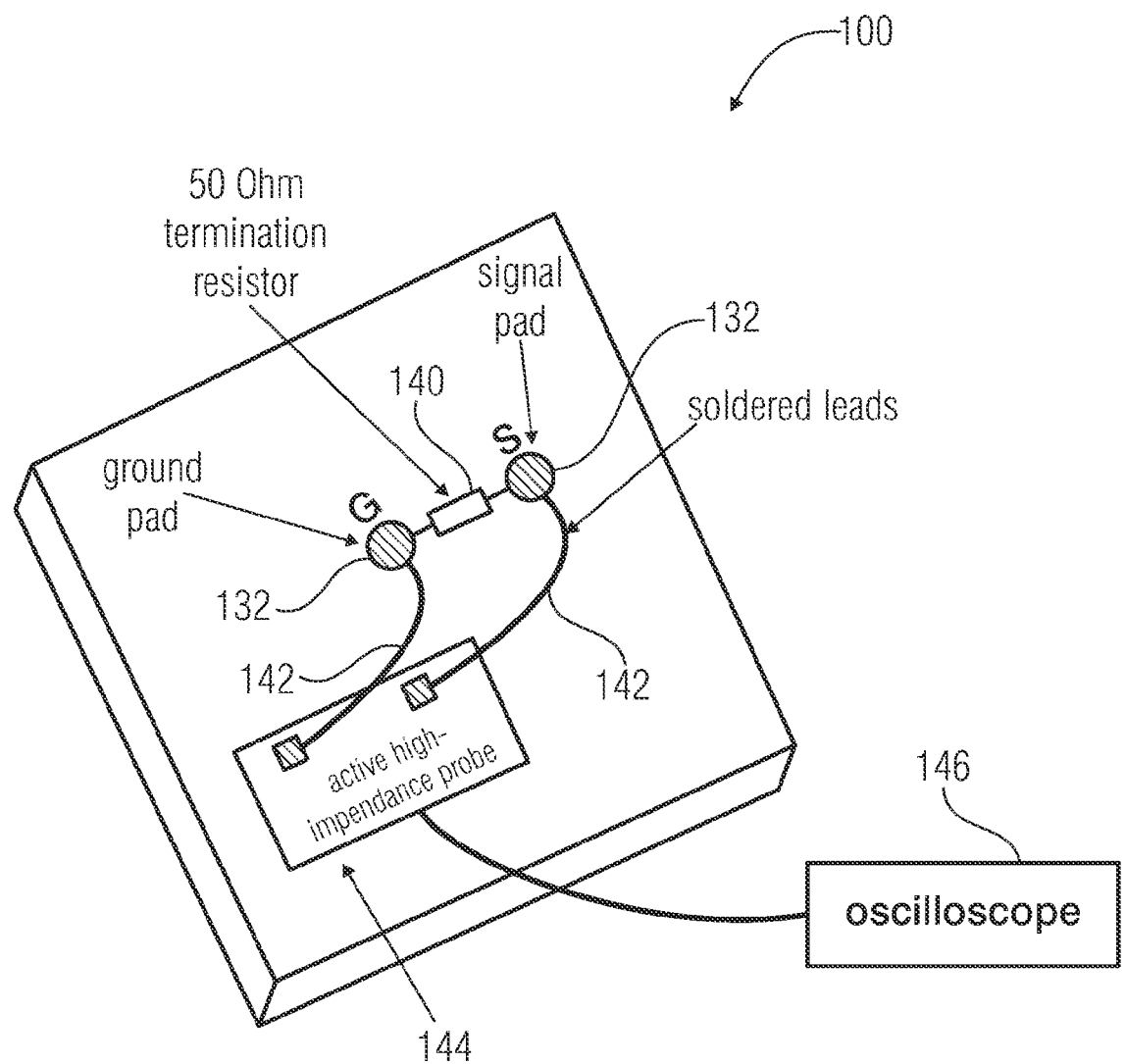
FIG. 6a shows an illustrative view of an implementation example of a probing pad for a high-impedance probing approach according to an embodiment of the present invention.

FIG. 6a shows an illustrative view of an implementation example of probing pads 132 according to an embodiment of the present invention. In other words, FIG. 6a shows a possible option for the design of the probing pads 132. Thereby, two vias 106 can be used, one for the signal and another for ground in a single-ended configuration and two leads 142 can be soldered to them that connect to a high-impedance active probe 144 which in turn can be connected to an oscilloscope 146. A 50Ω resistor 140 (or termination resistor 140) can be added to prevent reflections going back to the probing point.

Figure 6B:
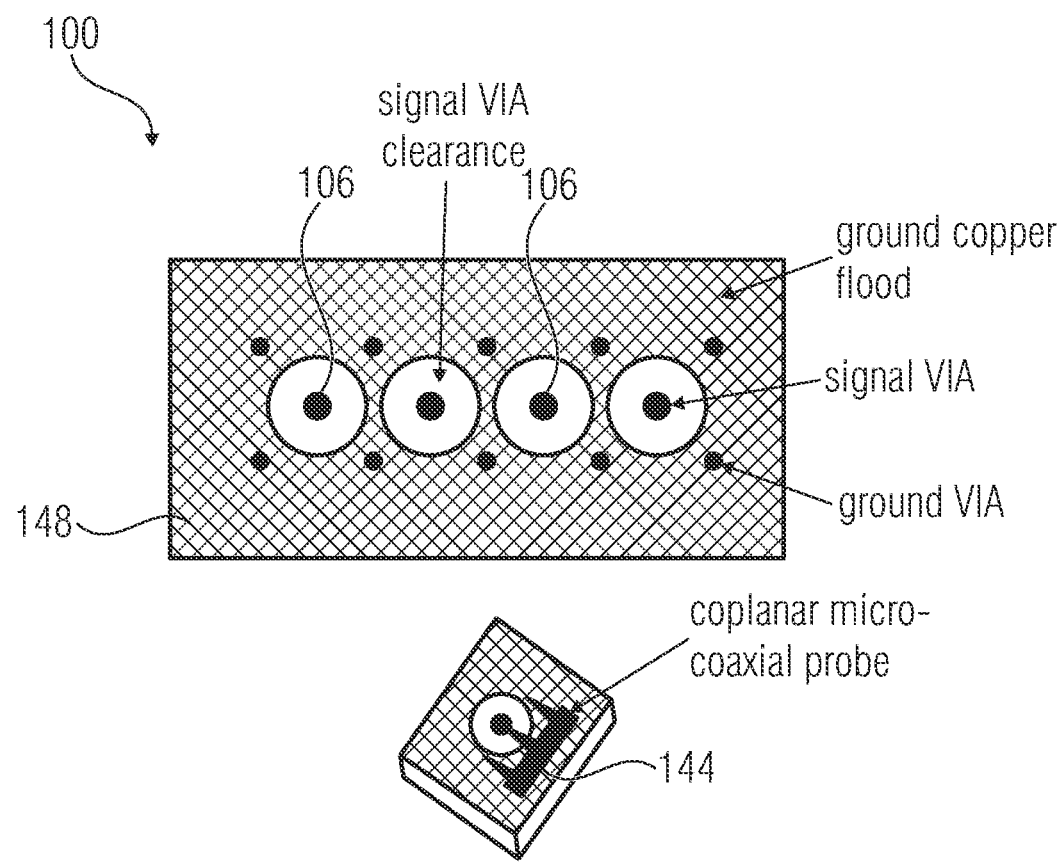
FIG. 6b shows an illustrative view of an implementation example of a probing pad for a coaxial type probing approach according to an embodiment of the present invention.

FIG. 6b shows an illustrative view of an implementation example of probing pads 132 according to an embodiment of the present invention. In other words, FIG. 6b shows a possible option for the design of the probing pads 132. In FIG. 6b only signal vias 106 are present with a clearance around them separating from a filled ground plane 148 (or filled copper area 148) that can be connected to the ground tip of a fixed pitch micro-coaxial probe. In this configuration a 50Ω micro-coaxial co-planar probe can be used to measure the probed signal 110 (or extracted signal 110) where the clearance pitch corresponds to the probe pitch.

Figure 7:
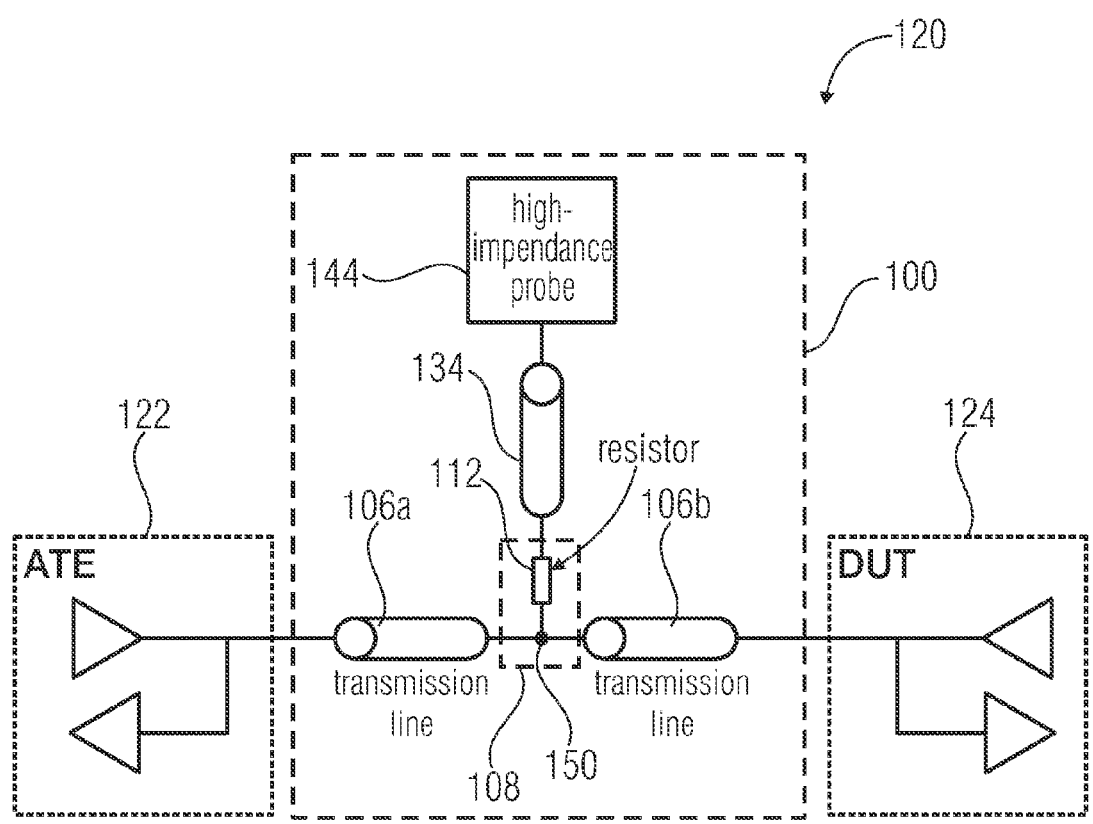
FIG. 7 shows a block diagram of the system level view of a possible probing implementation using a single resistor according to an embodiment of the present invention.

FIG. 7 shows a block diagram of an automatic test equipment system 120 according to an embodiment of the present invention. The automatic test equipment system 120 comprises the printed circuit board 100, an automatic test equipment 122 and a device under test 124. The extracting circuit 108 of the printed circuit board 108 comprises a resistor 112 that is electrically coupled to the one transmission line 106. Note that the one transmission line 106 can be divided into a first part 106a and a second part 106b, wherein the first part 106a of the one transmission line 106, the second part 106b of the one transmission line 106 and the resistor can be connected in a common node 150. Furthermore, the resistor 112 of the extracting circuit 108 can be electrically coupled by means of the probing transmission line 134 to the high impedance probe 144 comprising the probing terminal 132 and the termination resistor 140 connected in series between the probing terminal 132 and a ground potential (or a ground terminal) of the printed circuit board 100.

In other words, FIG. 7 shows a probing setup using a single resistor 112. There are several options for the probing circuit 108 implementation. A simple approach is to use a single embedded resistor 112 on the probing interposer 100 that is connected to a high-impedance probe 144 with an amplifying transistor as shown in FIG. 7.

Figure 8:
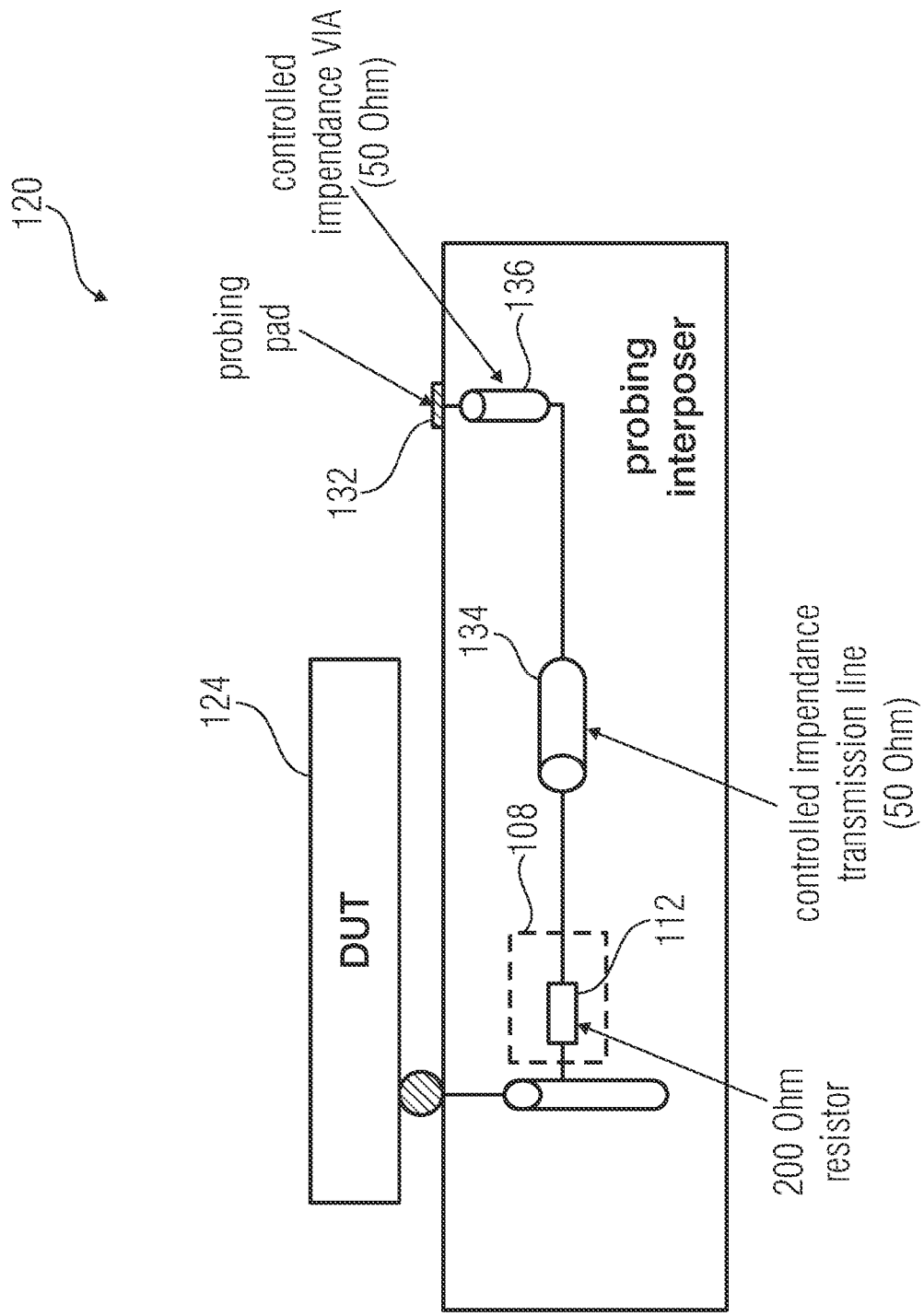
FIG. 8 shows a block diagram of the automatic test equipment system shown in FIG. 7.

FIG. 8 shows a block diagram of the automatic test equipment system 120 shown in FIG. 7. The resistor 112 of the extracting circuit 108 is electrically coupled to the one transmission line 106 and to the probing terminal 132 (e.g. a probing pad 132) by means of a probing transmission line 134 and a probing via 136. The probing transmission line 134 and/or the probing via 136 may need to have a controlled impedance given that the transmission line length can be larger than the probed signal rise-time. This impedance be the same of the transmission line 106, e.g. 50Ω (or 60Ω, or 70Ω, or 100Ω) or different depending on the probing circuit design.

In other words, FIG. 8 shows a more detailed schematic of the implementation of FIG. 7, where it is shown that after the probing resistor 112 a controlled impedance transmission line 144 and via 136 (e.g. having an impedance of 50 Ohm) can be used until the probing pad 132.

Figure 9A:
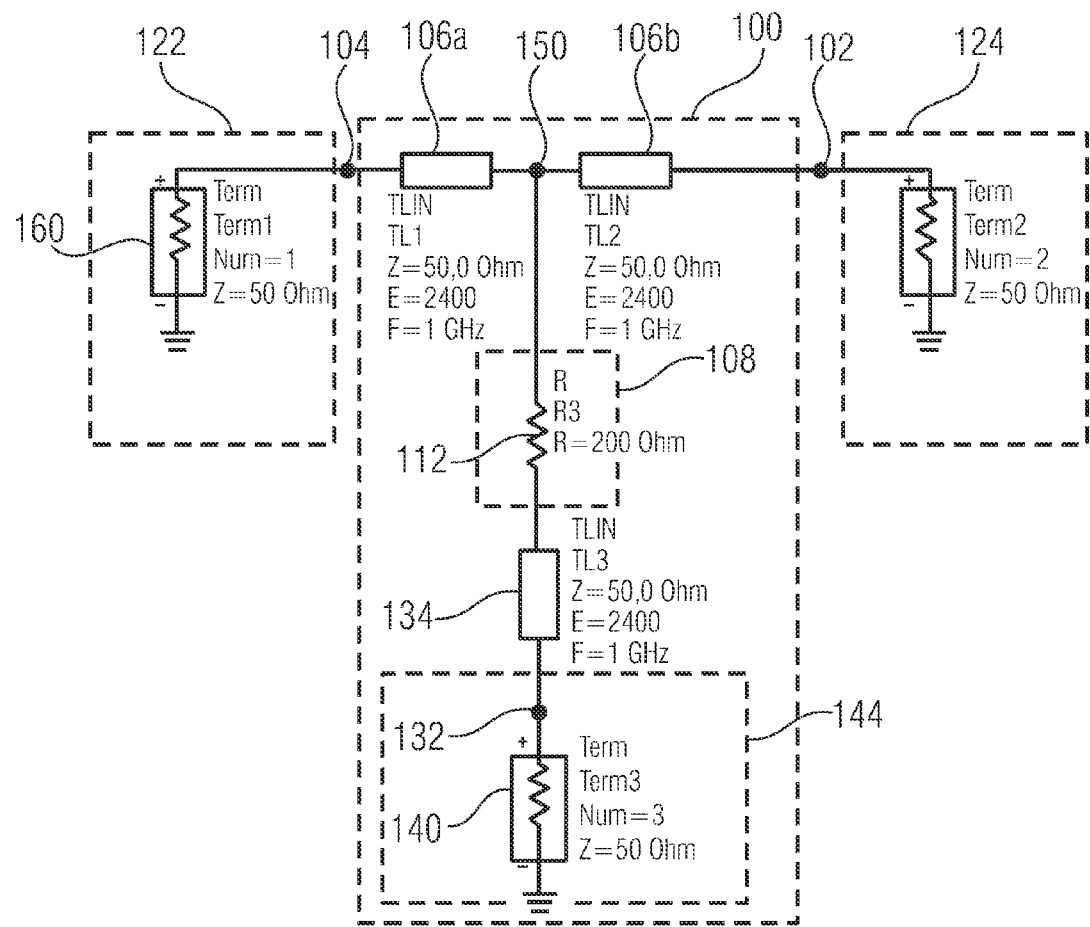
FIG. 9a shows a schematic for simulating the automatic test equipment system shown in FIGS. 7 and 8.

FIG. 9a shows a schematic for simulating the automatic test equipment system 120 shown in FIGS. 7 and 8. The automatic test equipment is simulated by means of an (internal) impedance 160 of 50Ω connected in series between the second terminal 104 and a ground terminal of the automatic test equipment 122. The device under test 124 is simulated by means of an (internal) impedance of 50 Ohm connected in series between the first terminal 102 and a ground terminal of the device under test 124.

The printed circuit board 100 comprises a first impedance 106a of 50Ω and a second impedance 106b of 50Ω connected in series between the first terminal 102 and the second terminal 104 in order to simulate the one transmission line 106. The extracting circuit 108 of the printed circuit board 100 is simulated by means of a resistor 112 of 200Ω connected to a common node 150 of the series connection of the first impedance 106a and the second impedance 106b, thereby providing a T-connection of the first impedance 106a, the second impedance 106b and the resistor 112. The probing transmission line 134 is simulated by means of an impedance 134 of 50Ω connected in series between the resistor 112 and the probing terminal 132 of the high impedance probe 144. The high impedance probe 144 comprises a termination resistor 140 simulated by means of an impedance 140 of 50Ω connected in series between the probing terminal 132 and a ground terminal of the printed circuit board 100.

FIG. 9b shows in a diagram simulation results obtained with the schematic shown in FIG. 9a for simulating the automatic test equipment system 120. In FIG. 9b, the ordinate describes a loss in dB, where the abscissa describes a frequency in GHz. According to the simulation results, the added loss between the device under test 124 and the automatic test equipment 122 is equal to 1 dB, where the loss at the probing point 132 is equal to 15 dB. Moreover, the return loss of the probing port 132 is equal to −4 dB, where the return loss of the automatic test equipment 122 port 104 and the device under test 124 port 102 is equal to −21 dB. All this values are related to the choice of the probing resistor value and depending on the application needs the resistor value can be optimized through simulation.

In other words, FIGS. 9a and 9b show a simulation of the approach according to the present invention where it can be observed that there is (almost) no impact on the insertion loss between the automatic test equipment 122 pin electronics and the device under test 124. Since the probed signal 110 (or extracted signal 110) will have a very low amplitude (in the simulation case using a 200Ω resistor 112, it is attenuated by approximately 15 dB), an active amplifier can be used to measure the signal. Moreover, in order to avoid additional signal integrity issues between the probing resistor 112 and the oscilloscope probe due to signal reflections on the probing transmission line 134 (the critical distance will depend on the rise-time of the signal being measured), the oscilloscope probe can be arranged near the probing resistor 112 on the interposer 100.

Figure 10A:
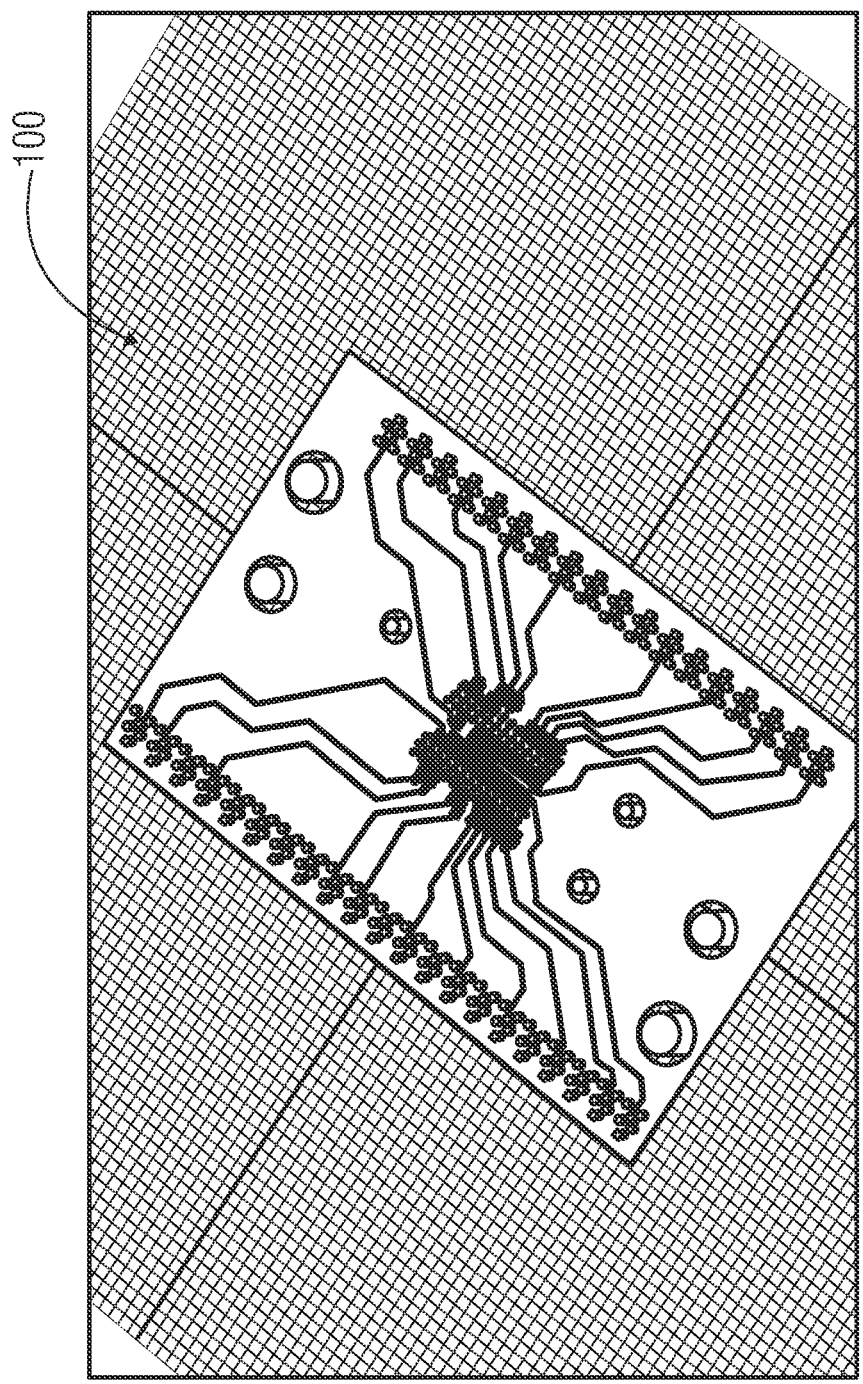
FIG. 10a shows an illustrative view of an implementation example of the top signal layer and the reference ground plane of the printed circuit board according to an embodiment of the present invention.
Figure 10B:
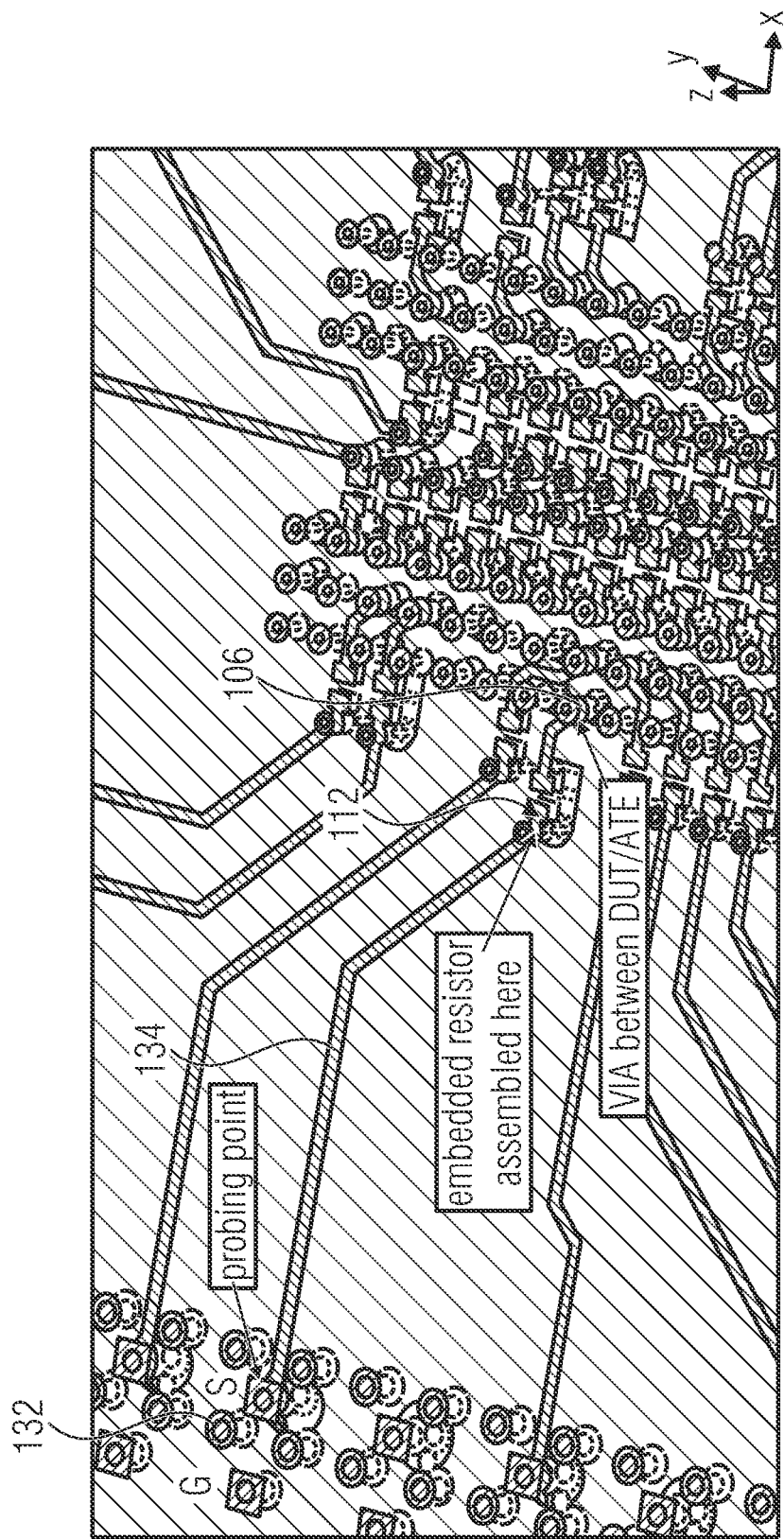
FIG. 10b shows an illustrative view of an implementation example of the top signal layer and the reference ground plane of the printed circuit board according to an embodiment of the present invention.

FIGS. 10a and 10b show illustrative views of an implementation example of the printed circuit board 100 according to an embodiment of the present invention. The resistor 112 is electrically coupled to the one of the plurality of transmission lines 106 in order to extract the signal being exchanged between the device under test 124 and the automatic test equipment 122 over the one transmission line 106. Moreover, the resistor 112 is electrically coupled to the probing terminal 112 by means of a probing transmission line 134 that can be implemented by means of a microstrip arranged on the top signal layer 114 of the printed circuit board 100.

In other words, FIGS. 10a and 10b show three-dimensional drawings of a possible implementation of the probing interposer 100 on a printed circuit board. The probing transmission line 134 can be implemented using an embedded microstrip approach. Two signal layers (first layer 114 and second layer 116) can be used to route all signals in this design example for a DDR3 device (DDR3=double data rate type three). Thereby, the probing interposer PCB 100 can have the following stack up: top/dielectric/signal/dielectric/reference plane/dielectric/signal/dielectric/bottom.

Figure 11:
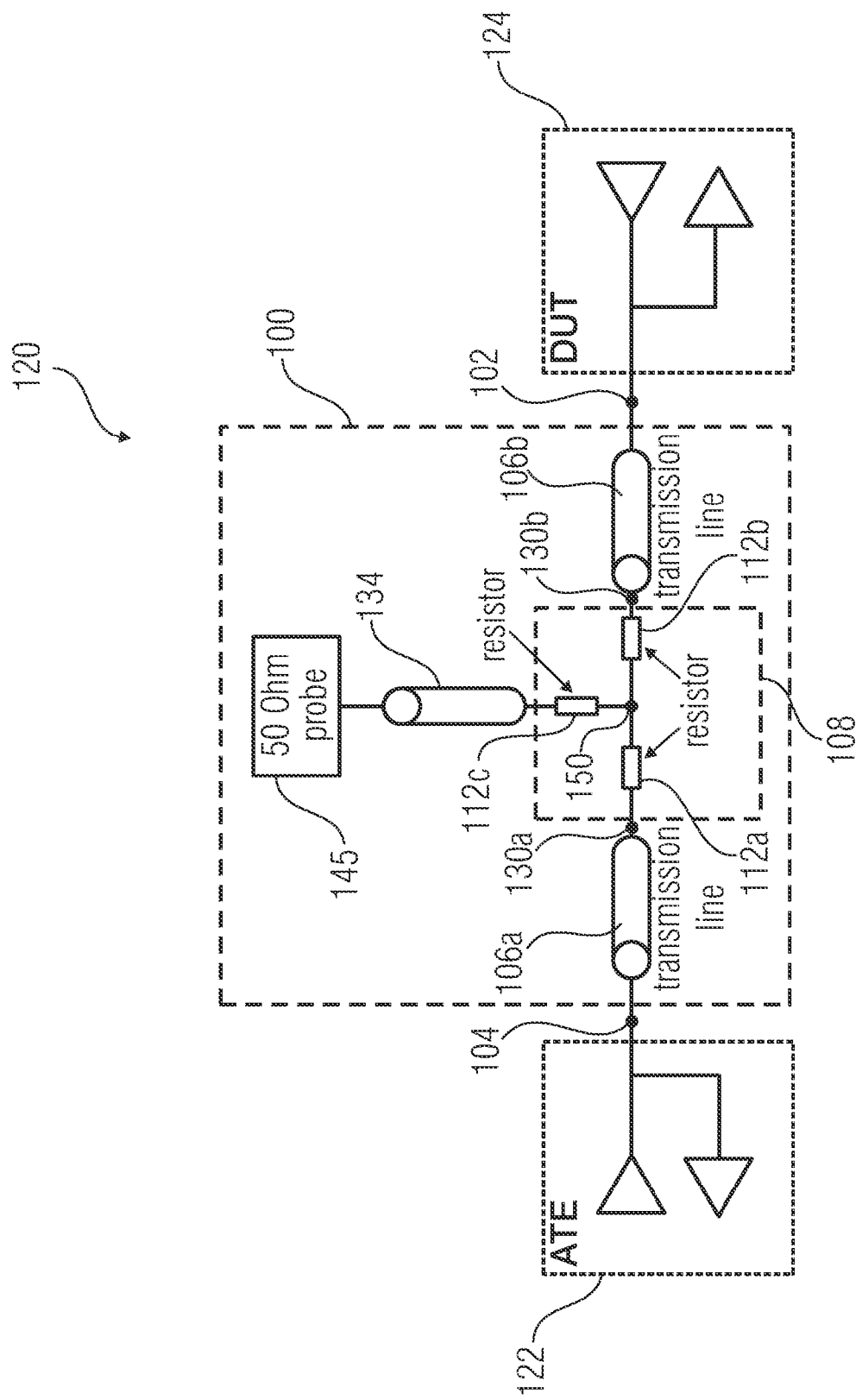
FIG. 11 shows a block diagram of the system level view of a possible probing implementation using a resistor network according to an embodiment of the present invention.

FIG. 11 shows a block diagram of an automatic test equipment system 120 according to an embodiment of the present invention. The automatic test equipment system 120 comprises a printed circuit board 100, an automatic test equipment 122 and a device under test 124. The printed circuit board 100 (or probing interposer 100) is inserted between the automatic test equipment 122 and the device under test 124 in order to extract a signal being exchanged between the device under test 124 and the automatic test equipment 124 over one of the plurality of transmission lines 106.

The extracting circuit 108 of the printed circuit board 108 comprises a first port 130a having an impedance adapted to the impedance of the one transmission line 106 and a second port 130b having an impedance adapted to the impedance of the one transmission line 106, wherein the transmission line 106 is divided into a first part 106a and a second part 106b. The first part 106a of the one transmission line 106 is connected to the first port 130a of the extracting circuit 108, wherein the second part 106b of the one transmission line 106 is connected to the second port 130b of the extracting circuit 108. Moreover, the extracting circuit 108 can comprise a T-connection (or Y-connection) of three resistors 112a to 112c connected in a common node 150, wherein a first resistor 112a and a second resistor 112b of the three resistors 112a to 112c are connected in series between the first port 130a and the second port 130b of the extracting circuit 108. A third resistor 112c of the three resistors 112a to 112c can be electrically coupled to coaxial probe 145 (e.g. a 50Ω, 60Ω, 70Ω or 100Ω probe) by means of a probing transmission line 134. A high impedance probe can also be used but would necessitate an additional termination resistor.

In other words, another probing circuit 108 approach is to use a pick-off-T-circuit 108 where three resistors 112a to 112c can be used to create a matched probing circuit 108. An advantage of this approach is that if the resistor values are properly chosen, there will be a matched impedance (e.g. 50Ω, 60Ω, 70Ω or 100Ω) on the automatic test equipment ports 104 and the device under test ports 102 of the circuit.

Figure 12:
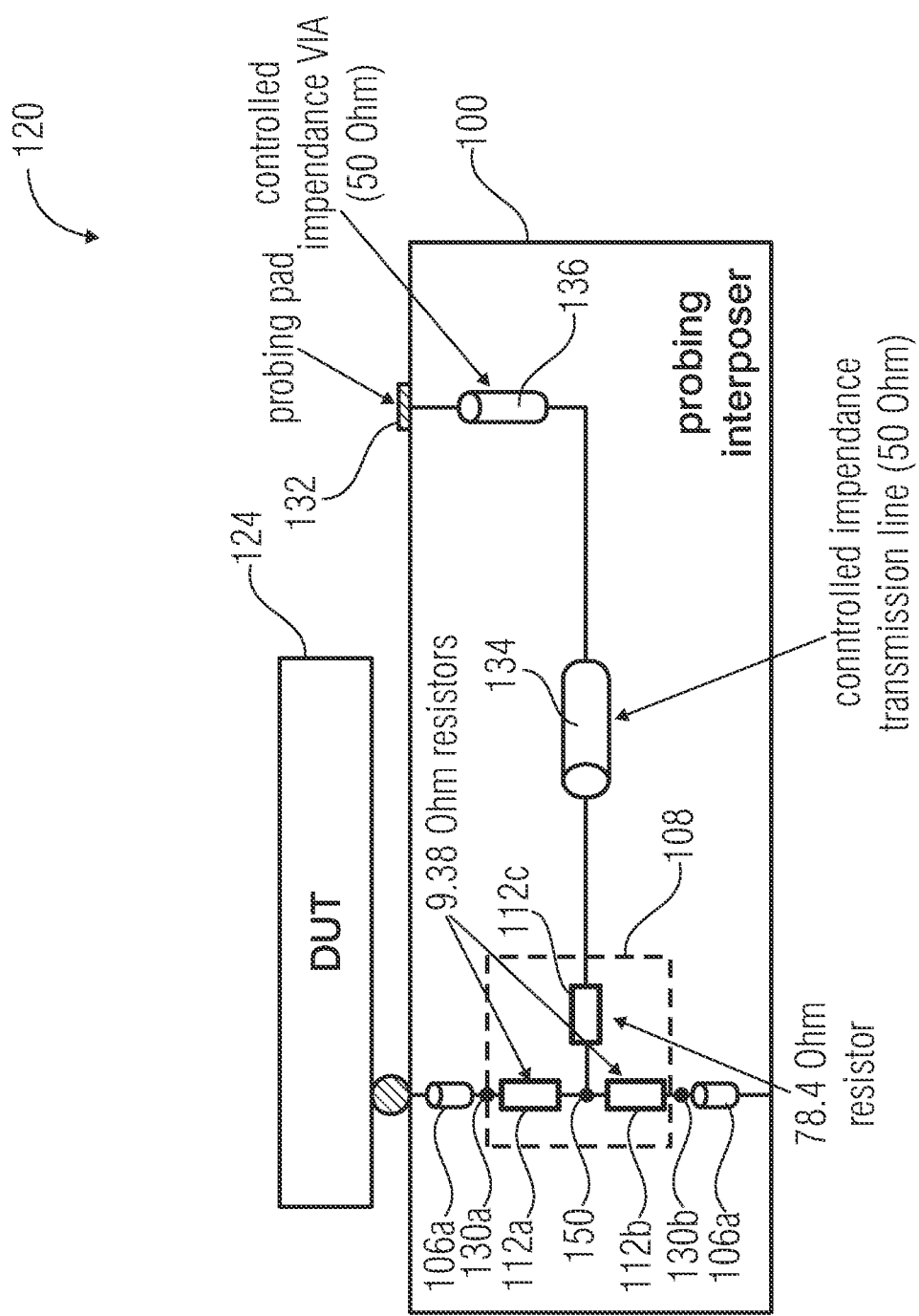
FIG. 12 shows a block diagram of the automatic test equipment system shown in FIG. 11.

FIG. 12 shows a block diagram of the automatic test equipment system 120 shown in FIG. 11 for the case of a 50Ω ATE system and DUT. The first resistor 112a and the second resistor 112b are connected in series between the first port 130a and the second port 130b of the extracting circuit 108. The third resistor 112c of the extracting circuit 108 can be electrically coupled to the probing terminal 132 by means of the probing transmission line 134 and the probing via 136 having impedances adapted to the impedance of the one transmission line 160.

For example, in order to provide an impedance of 50Ω at the first port 130a and an impedance of 50Ω at the second port 130b of the extracting circuit 108, the first resistor 112a and the second resistor 112b can comprise a resistance of 9.38Ω each, wherein the third resistor 112c can comprise a resistance of 78.4 Ω.

In other words, FIG. 12 shows a more detailed schematic of the implementation of FIG. 11 where it is shown that after the resistor network (T-connection of the three resistors 112a to 112c) a controlled impedance transmission line and via (e.g. of 50Ω, 60Ω, 70Ω or 100Ω) can be used until the probing pad 132.

Figure 13A:
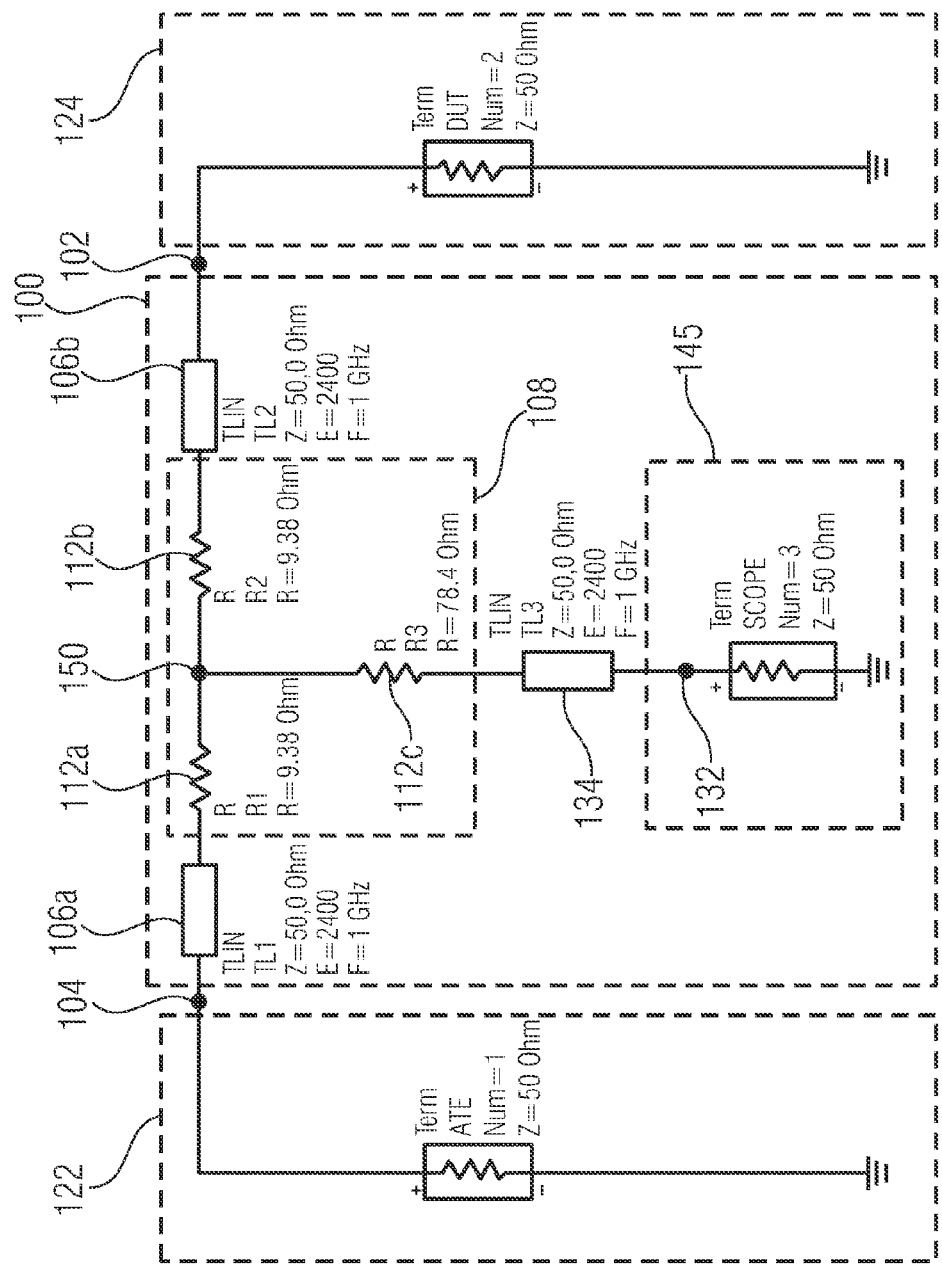
FIG. 13a shows a schematic for simulating the automatic test equipment system shown in FIGS. 11 and 12.

FIG. 13a shows a schematic for simulating the automatic test equipment system 120 shown in FIGS. 11 and 12. The automatic test equipment 122 is simulated by means of an (internal) impedance 160 of 50Ω connected in series between the second terminal 104 and a ground terminal of the automatic test equipment 122. The device under test 124 is simulated by means of an (internal) impedance of 50 Ohm connected in series between the first terminal 102 and a ground terminal of the device under test 124.

The printed circuit board 100 comprises a first impedance 106a of 50Ω connected in series between the first terminal 102 and the first port 130a of the extracting circuit in order to simulate the first part 106a of the one transmission line 106. Furthermore, the printed circuit board 100 comprises a second impedance 106b of 50Ω connected in series between the second terminal 104 and the second port 130b of the extracting circuit 108 in order to simulate the second part 106b of the one transmission line 106. The extracting circuit 108 is simulated by means of a T-connection of three resistors 112a to 112c, wherein a first resistor 112a of the three resistors 112a to 112c and a second resistor 112b of the three resistors 112a to 112c are connected in series between the first port 130a and the second port 130b of the extracting circuit 108. The first resistor 112a and the second resistor 112b comprise a resistance of 9.38Ω each, wherein a third resistor 112c of the three resistors 112a to 112c comprises a resistance of 78.4Ω. The probing transmission line 134 can be simulated by means of an impedance 134 of 50Ω connected in series between the third resistor 112c and the probing terminal 132 of the coaxial probe 145. The 50Ω coaxial probe 145 comprises a 50Ω termination resistor that is part of the measurement external instrument when using a coaxial probe.

FIG. 13b shows in a diagram simulation results obtained with the schematic shown in FIG. 13a for simulating the automatic test equipment system 120. In FIG. 13b, the ordinate describes a signal amplitude in dB, where the abscissa describes a frequency in GHz. According to the simulation results, the added loss between the device under test 124 and the automatic test equipment 122 is equal to 3.5 dB, where the loss at the probing point 132 is equal to 10 dB. Moreover, the return loss of the probing port 132 is equal to −10 dB, where the return loss of the automatic test equipment 122 ports 104 and the device under test 124 ports 102 is equal to −75 dB.

In other words, FIGS. 13a and 13b show a simulation of the approach shown in FIG. 12 where it can be observed that there is a 3.5 dB insertion loss between the automatic test equipment 122 pin electronics and the device under test 124, but the return loss of the automatic test equipment ports 104 and the device under test ports 102 is below −70 dB, which is much better than with the single resistor 112 probing circuit 108 shown in FIG. 8. But since this added insertion loss is frequency independent if the circuit is properly designed, it can be compensated by properly adjusting the automatic test equipment 122 pin electronics driver levels and post-calibrating the measured values from the device under test 124. The loss of the probed signal is 10 dB which could allow the use of a passive micro-coaxial 50 Ohm probe instead of a high-impedance probe with the corresponding amplifier.

Figure 14A:
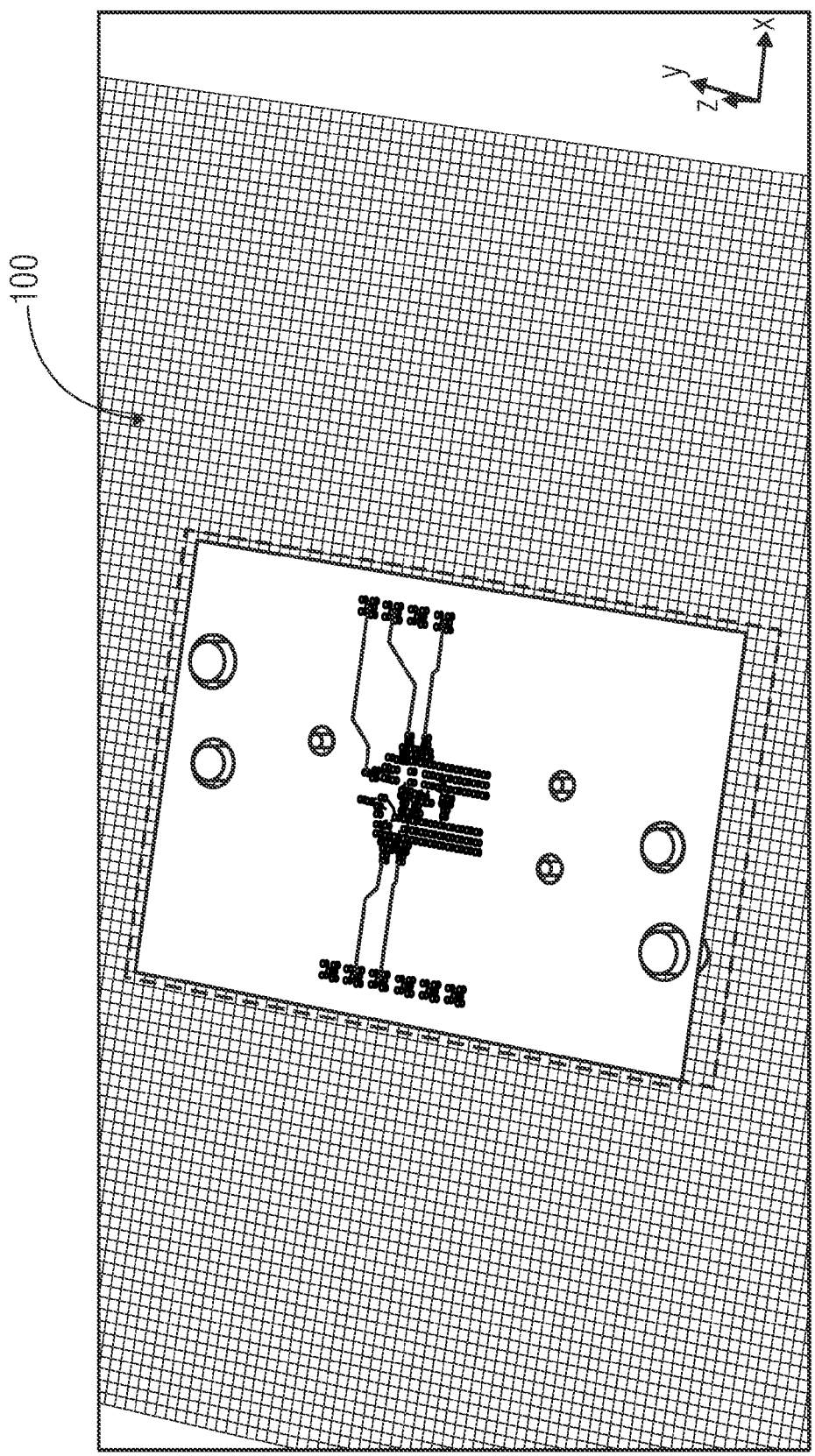
FIG. 14a shows an illustrative view of an implementation example of the top signal layer and the reference ground plane of the printed circuit board according to an embodiment of the present invention.
Figure 14B:
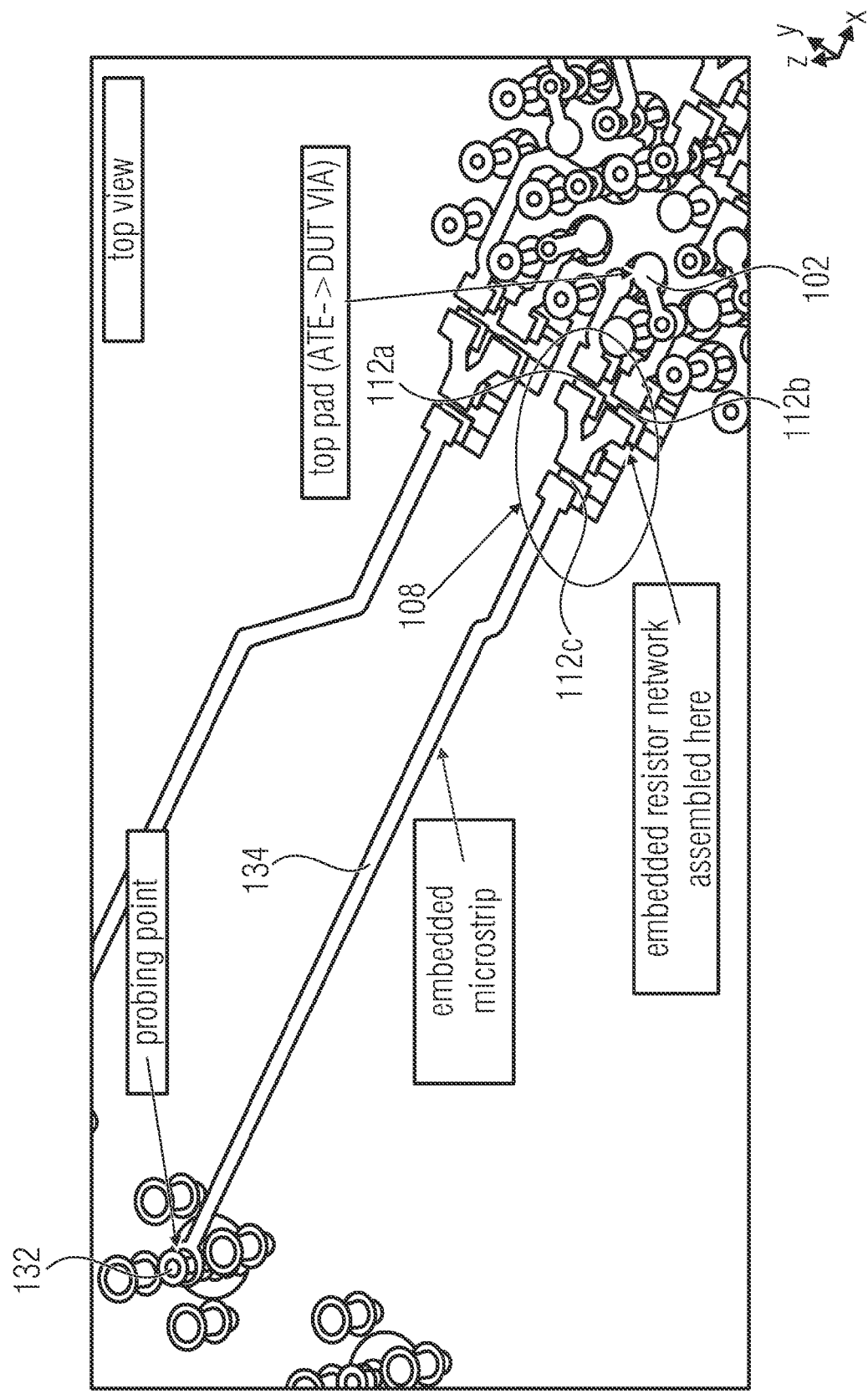
FIG. 14b shows an illustrative view of an implementation example of the top signal layer and the reference ground plane of the printed circuit board according to an embodiment of the present invention.

FIGS. 14a and 14b show illustrative views of an implementation example of the top signal layer 114 and the reference ground plane of the printed circuit board 100 according to an embodiment of the present invention. The extracting circuit 108 comprising the T-connection (or Y-connection) of the three resistors 112a to 112c can be arranged on the first layer 114 of the printed circuit board 100. The extracting circuit 108 can be electrically coupled to one of the plurality of transmission lines 106 in order to extract the signal being exchanged between the device under test 124 and the automatic test equipment 122 over the one transmission line 106. Moreover, the third resistor 112c can be electrically coupled to the probing terminal 112 by means of a probing transmission line 134 that can be implemented by means of a microstrip arranged on the first layer 114 of the printed circuit board 100.

Figure 14C:
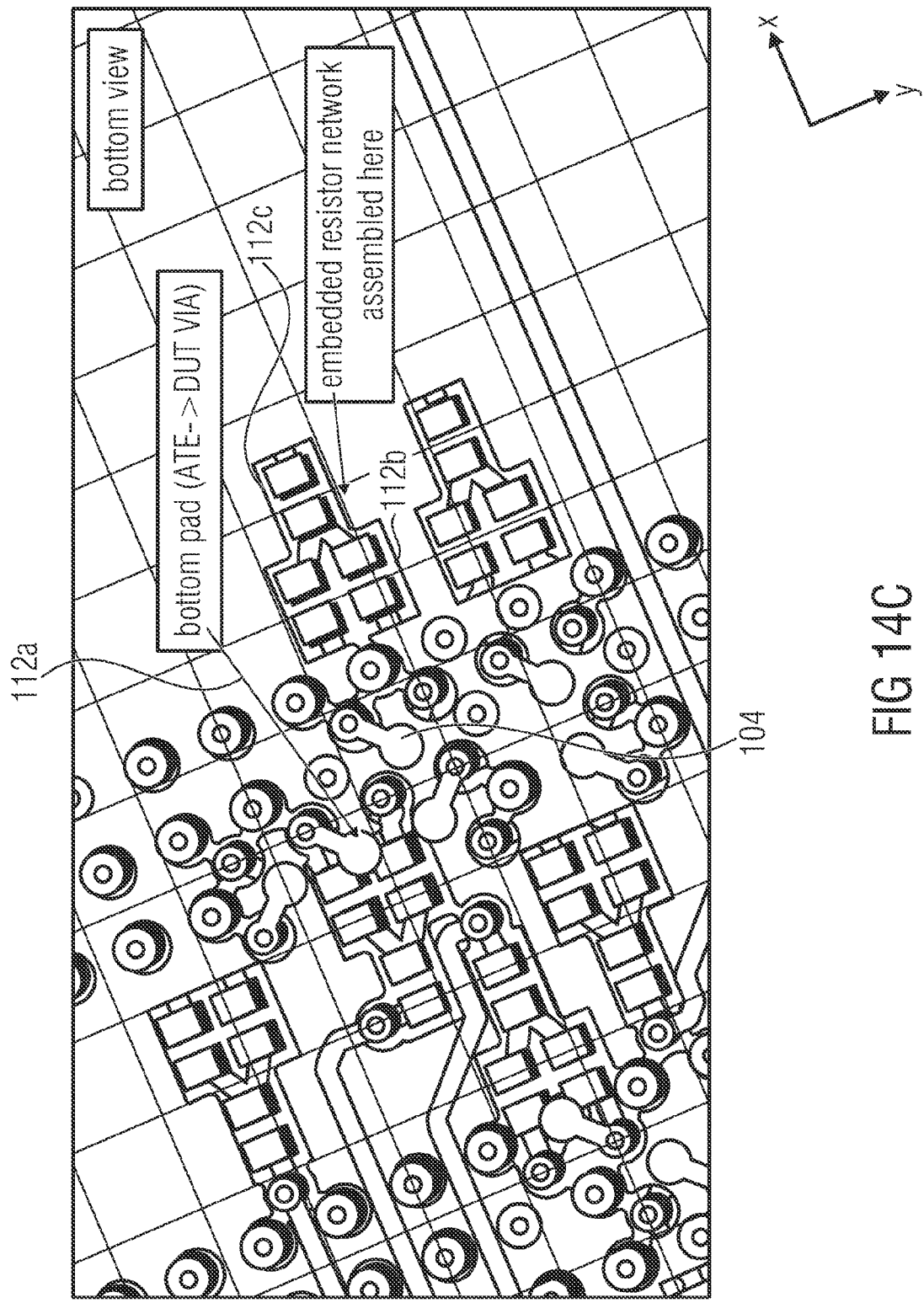
FIG. 14c shows an illustrative view of an implementation example of the bottom signal layer and the reference ground plane of the printed circuit board according to an embodiment of the present invention.

FIG. 14c show an illustrative view (bottom view) of an implementation example of the bottom signal layer 114 and the reference ground plane of the printed circuit board 100 according to an embodiment of the present invention. As shown in FIG. 14c, the extracting circuit 108 comprising the T-connection (or Y-connection) of the three resistors 112a to 112c can also be implemented on the second layer 116 of the printed circuit board 100.

In other words, FIGS. 14a to 14c show three-dimensional drawings of a possible implementation of the probing interposer 100 using a pick-off-T probing circuit 108 on a printed circuit board 100. The probing transmission line 134 can be implemented using an embedded microstrip approach. Two signal layers can be used to route all signals in this design example for a DDR3 device (DDR3=double data rate type three) where only the DQ pins (DQ=data (input and output) pins) are probed. Thereby, the probing interposer printed circuit board 100 can have the following stack up: top/dielectric/signal/dielectric/reference plane/dielectric/signal/dielectric/bottom. Note that due to the more complex probing circuit 108 with three resistors 112a to 112c the layout can be more complex compared to the layout shown in FIGS. 10a and 10b.

In the following, designing the extracting circuit 108 of the printed circuit board 112 (or probing interposer resistor network) is described for an specific example. Naturally, the following description can also be applied for designing an extracting circuit 108 comprising a different number of resistors and/or resistor values.

Figure 15:
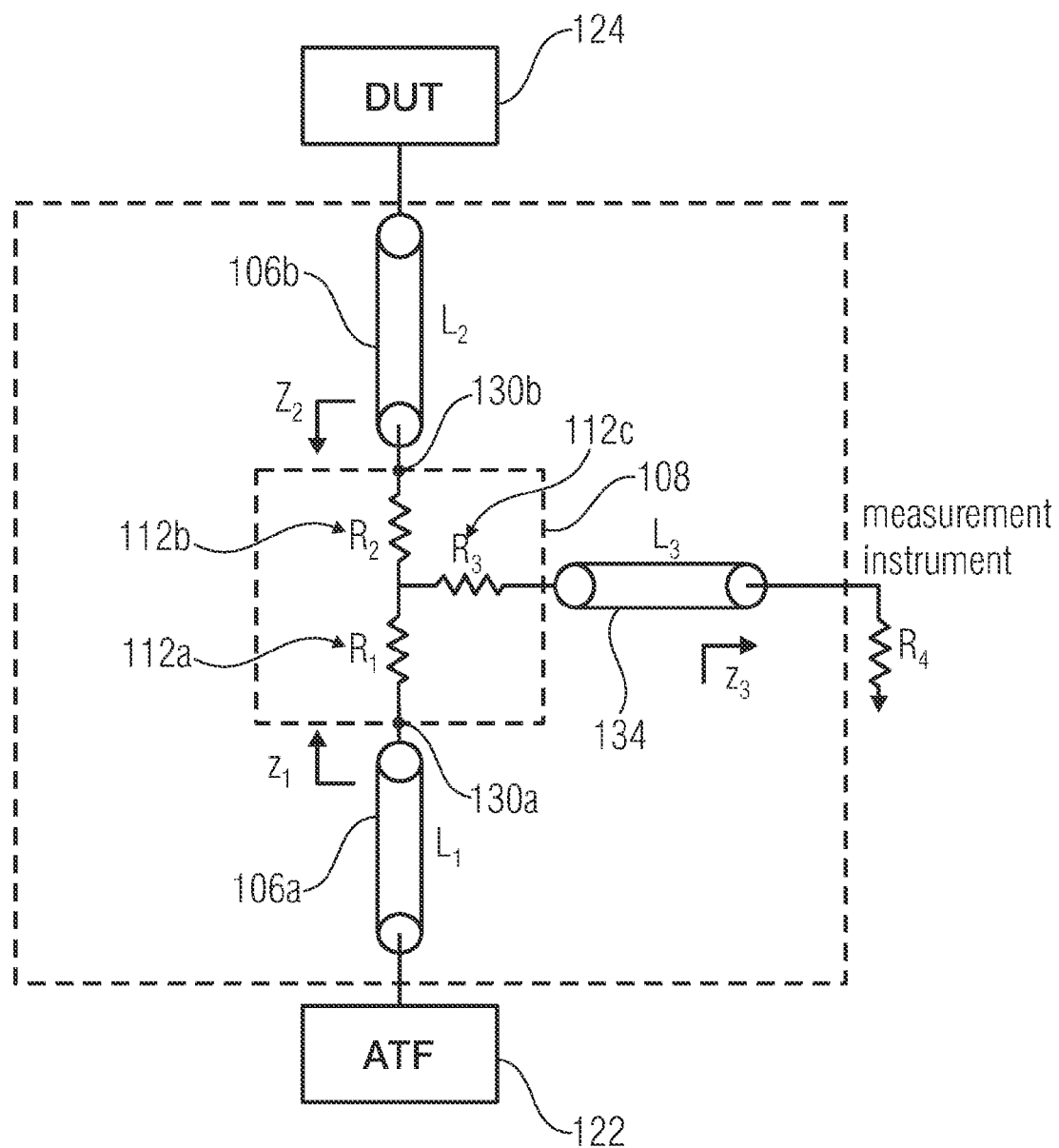
FIG. 15 shows an equivalent circuit of the automatic test equipment system shown in FIGS. 11 and 12.

FIG. 15 shows an equivalent circuit of the automatic test equipment system 120 shown in FIGS. 11 and 12. To design a probing setup with a high performance (e.g. with a DC to 10.5 GHz Bandwidth for GDDR 5 applications) it can be critical that the area A is reduced (or even as small as possible) with the target that the X, Y dimensions are smaller that wavelength of the highest frequency of interest.

In an application like GDDR5, all the impedances the transmission lines on the ATE test fixture 128 (either vias or striplines/microstips) and the socket pogo pin can be 50 Ohms. This means L1 (106a), L2 (106b) and L3 (134) are 50 Ohms.

To make sure there are no reflections from the probing point impedance discontinuity, it can be critical that the impedances seen in the Z1 and Z2 directions (at the first port 130a and second port 130b of the extracting circuit 108) are 50 Ohm. The impedance of the measurement instrument Z3 should also be 50 Ohm to guarantee that no reflections go back to the probing circuit 108. Some measurement instruments have a 50 Ohm matched input that contains the needed 50 ohm termination resistor, in the case this termination resistor is not part of the measurement instrument (like a high-impedance probe), the proper termination resistor 140 can be added to the circuit at the end of the transmission line L3 (134).

To decide the values of the resistors the following equation must hold:

Impedance $Z1=50$ Ohm$=R1+((R2+50)+(R3+50))/((R2+50)*(R3+50))$

Impedance $Z2=50$ Ohm$=R3+((R1+50)+(R3+50))/((R1+50)*(R3+50))$

In this type of networks it is usual to assume R1=R2 for symmetry reasons. If we assume R1=R2 the insertion loss between ATE 122 and DUT 124 and the probing loss are given by the following equations:

Added DC loss in the connection between $ATE$ to $DUT$: =

-continued
$$-20\log_{10}\left(\frac{\frac{(R_3+50\Omega)\times(R+50\Omega)}{R_3+R+100\Omega}}{\frac{(R_3+50\Omega)\times(R+50\Omega)}{R_3+R+100\Omega}+R}\times\frac{50\Omega}{R+50\Omega}\right)$$

Probing loss at DC: =

$$-20\log_{10}\left(\frac{\frac{(R+50\Omega)^2}{2R+100\Omega}}{\frac{(R+50\Omega)^2}{2R+100\Omega}+R}\times\frac{50\Omega}{R_3+50\Omega}\right)$$

It is important to understand that this is just a first pass computation approach and for more realistic results it is necessitated to use microwave simulation tools with realistic models that include all the parasitics that will happen on a manufactured product.

For an application like DDR4, a target insertion loss of less that 6 dB which can be easily compensated by proper compensation on the ATE pin electronics and a probing loss of 10 dB that can also be compensated by a low noise amplifier without to much signal degradation can be achieved by choosing R1=R2=9.38 Ohm and R3=78.4 Ohm. The insertion loss would be 3.3 dB and the probing loss would be 10.8 dB which is very close to our target.

Further embodiments of the present invention provide a method for extracting a signal being exchanged between a device under test and an automatic test equipment with a printed circuit board. The printed circuit board comprises a plurality of first terminals, a plurality of second terminals, a plurality of transmission lines and an extracting circuit. The plurality of first terminals are configured for contacting terminals of a socket where the device under test resides. The plurality of second terminals are configured for contacting terminals of a test fixture of the automatic test equipment, which are adapted for contacting the terminals of the socket of the device under test. The plurality of transmission lines are configured for connecting the plurality of first terminals and the plurality of second terminals. The extracting circuit is electrically coupled to one of the plurality of transmission lines and configured to extract the signal being exchanged between the device under test and the automatic test equipment over the one transmission line in order to provide an extracted signal, wherein the extracting circuit comprises a resistor or a resistor network, wherein a loss added on the signal being exchanged between the device under test and the automatic test equipment over the one transmission line due to the presence of the printed circuit board (e.g. due to an impedance discontinuity that is created by the single resistor or the resistor network) is smaller than 6 dB. The method comprises a step of arranging the printed circuit board between the socket of the device under test and the test fixture of the automatic test equipment such that the plurality of first terminals are contacting the terminals of the socket of the device under test and the plurality of second terminals are contacting the terminals of the test fixture of the automatic test equipment.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A printed circuit board for extracting a signal being exchanged between a device under test and an automatic test equipment, the printed circuit board comprising:
   a plurality of first terminals for contacting terminals of a socket of the device under test;
   a plurality of second terminals for contacting terminals of a test fixture of the automatic test equipment which are adapted for contacting the terminals of the socket of the device under test;
   a plurality of transmission lines connecting the plurality of first terminals and the plurality of second terminals; and
   an extracting circuit electrically coupled to one of the plurality of transmission lines and configured to extract the signal being exchanged between the device under test and the automatic test equipment over the one transmission line in order to provide an extracted signal, wherein the extracting circuit comprises a resistor or a resistor network, wherein a loss added on the signal being exchanged between the device under test and the automatic test equipment over the one transmission line due to the presence of the printed circuit board is smaller than 6 dB.

2. The printed circuit board according to claim 1, wherein the resistor or the resistor network of the extracting circuit is adapted to an impedance of the one transmission line such that a loss of the signal being exchanged between the device under test and the automatic test equipment over the one transmission line is smaller than 10 dB.

3. The printed circuit board according to claim 1, wherein the extracting circuit comprises a first port comprising an impedance adapted to the impedance of the one transmission line and a second port comprising an impedance adapted to the impedance of the one transmission line, wherein the transmission line is divided into a first part and a second part, wherein the first part of the one transmission line is connected to the first port of the extracting circuit and wherein the second part of the one transmission line is connected to the second port of the extracting circuit.

4. The printed circuit board according to claim 3, wherein the extracting circuit comprises a T-connection or Y-connection of three resistors, wherein a first resistor and a second resistor of the three resistors are connected in series between the first port and the second port of the extracting circuit.

5. The printed circuit board according to claim 4, wherein the first resistor and the second resistor comprise the same resistance.

6. The printed circuit board according to claim 1, wherein each of the plurality of transmission lines comprises an impedance adapted to an impedance of the automatic test equipment and/or an impedance of the device under test.

7. The printed circuit board according to claim 1, wherein the plurality of first terminals are arranged on a first layer of the printed circuit board and wherein the plurality of second terminals are arranged on a second layer of the printed circuit board different from the first layer.

8. The printed circuit board according to claim 7, wherein the plurality of first terminals or the plurality of second terminals comprise a conductive elastomeric material.

9. The printed circuit board according to claim 7, wherein the plurality of transmission lines are vias connecting the plurality of first terminals arranged on the first layer of the printed circuit board and the plurality of second terminals arranged on the second layer of the printed circuit board.

10. The printed circuit board according to claim 7, wherein the first layer or the second layer comprise a filled ground plane electrically isolated from non-ground terminals and/or non-ground transmission lines, wherein the filled ground plane is configured for contacting a ground potential of the automatic test equipment, a ground potential of the device under test and/or a ground potential of an external measurement instrument.

11. The printed circuit board according to claim 1, comprising a probing terminal electrically coupled to the extracting circuit for providing the extracted signal.

12. The printed circuit board according to claim 11, wherein the probing terminal is electrically coupled to the extracting circuit by means of a probing transmission line comprising an impedance adapted to the impedance of the one transmission line.

13. The printed circuit board according to claim 12, wherein the probing terminal is electrically coupled to the probing transmission line by means of a probing via comprising an impedance adapted to the impedance of the one transmission line.

14. The printed circuit board according to claim 12, wherein the probing transmission line is a micro strip.

15. The printed circuit board according to claim 11, comprising a termination resistor connected in series between the probing terminal and a ground potential of the printed circuit board, wherein the termination resistor is adapted to the impedance of the one transmission line.

16. The printed circuit board according to claim 1, wherein the plurality of first terminals are configured for non-permanently contacting the terminals of the socket of the device under test and wherein the plurality of second terminals are configured for non-permanently contacting the terminals of the test fixture of the automatic test equipment such that the printed circuit board is removable.

17. The printed circuit board according to claim 1, wherein an insertion loss of the signal being exchanged between the device under test and the automatic test equipment over the one transmission line due to an impedance discontinuity of the printed circuit board is smaller than 6 dB.

18. The printed circuit board according to claim 1, wherein a return loss of the signal being exchanged between the device under test and the automatic test equipment over the one transmission line due to the presence of the printed circuit board is smaller than −10 dB.

19. The printed circuit board according to claim 1, wherein the extracting circuit is configured to provide the extracted signal such that a loss of the extracted signal compared to the signal being exchanged between the device under test and the automatic test equipment over the one transmission line is smaller than 20 dB.

20. The printed circuit board according to claim 1, wherein the extracting circuit is configured to provide the extracted signal such that a return loss of the extracted signal is smaller than −4 dB.

21. An automatic test equipment system, comprising: a device under test comprising a socket with terminals; an automatic test equipment comprising a test fixture with terminals which are adapted for contacting the terminals of the socket of the device under test; and a printed circuit board for extracting a high-frequency signal being exchanged between the device under test and the automatic test equipment, the printed circuit board comprising: a plurality of first terminals for contacting the terminals of the socket of the device under test; a plurality of second terminals for contacting terminals of the test fixture of the automatic test equipment; a plurality of transmission lines connecting the plurality of first terminals and the plurality of second terminals; and an extracting circuit electrically coupled to one of the plurality of transmission lines and configured to extract the signal being exchanged between the device under test and the automatic test equipment over the one transmission line, wherein the extracting circuit comprises a resistor or an electrical resistor network, wherein a loss added on the signal being exchanged between the device under test and the automatic test equipment over the one transmission line due to the presence of the printed circuit board is smaller than 6 dB;

wherein the printed circuit board is arranged between the socket of the device under test and the test fixture of the automatic test equipment such that the plurality of first terminals are contacting the terminals of the socket of the device under test and the plurality of second terminals are contacting the terminals of the test fixture of the automatic test equipment.

22. A method for extracting a signal being exchanged between a device under test and an automatic test equipment with a printed circuit board comprising:

a plurality of first terminals for contacting the terminals of the socket of the device under test;
a plurality of second terminals for contacting terminals of the test fixture of the automatic test equipment;
a plurality of transmission lines connecting the plurality of first terminals and the plurality of second terminals; and
an extracting circuit electrically coupled to one of the plurality of transmission lines and configured to extract the signal being exchanged between the device under test and the automatic test equipment over the one transmission line, wherein the extracting circuit comprises a resistor or an electrical resistor network, wherein a loss added on the signal being exchanged between the device under test and the automatic test equipment over the one transmission line due to the presence of the printed circuit board is smaller than 6 dB;

wherein the method comprises:
arranging the printed circuit board between the socket of the device under test and the test fixture of the automatic test equipment such that the plurality of first terminals are contacting the terminals of the socket of the device under test and the plurality of second terminals are contacting the terminals of the test fixture of the automatic test equipment.

23. A non-transitory computer readable storage medium comprising program code for performing, when running on a computer or microprocessor, a method according to claim 22.

* * * * *